(12) United States Patent
Iwanaga et al.

(10) Patent No.: US 7,986,002 B2
(45) Date of Patent: Jul. 26, 2011

(54) FINFET-TYPE SEMICONDUCTOR DEVICE AND METHOD FOR FABRICATING THE SAME

(75) Inventors: Junko Iwanaga, Osaka (JP); Takeshi Takagi, Kyoto (JP); Yoshihiko Kanzawa, Kyoto (JP); Haruyuki Sorada, Osaka (JP); Tohru Saitoh, Osaka (JP); Takahiro Kawashima, Osaka (JP)

(73) Assignee: Panasonic Corporation, Osaka (JP)

( * ) Notice: Subject to any disclaimer, the term of this patent is extended or adjusted under 35 U.S.C. 154(b) by 285 days.

(21) Appl. No.: 10/549,291

(22) PCT Filed: Mar. 19, 2004

(86) PCT No.: PCT/JP2004/003808
§ 371 (c)(1),
(2), (4) Date: Sep. 14, 2005

(87) PCT Pub. No.: WO2004/084292
PCT Pub. Date: Sep. 30, 2004

(65) Prior Publication Data
US 2006/0208300 A1    Sep. 21, 2006

(30) Foreign Application Priority Data
Mar. 20, 2003   (JP) ................................. 2003-078002

(51) Int. Cl.
*H01L 29/66* (2006.01)
(52) U.S. Cl. .. 257/330; 257/343; 257/401; 257/E29.112; 257/E29.119; 257/E29.13; 257/E29.136; 438/259

(58) Field of Classification Search .................. 257/329, 257/E29.118, 330, 343, 401, E29.112, E29.119, 257/E29.13, E29.136; 438/212, 259
See application file for complete search history.

(56) References Cited

U.S. PATENT DOCUMENTS 4,356,211 A * 10/1982 Riseman ....................... 438/422
4,868,632 A *  9/1989 Hayashi et al. .............. 257/411
4,996,574 A *  2/1991 Shirasaki ....................... 257/66
(Continued)

FOREIGN PATENT DOCUMENTS
EP          0 623 963          11/1994
(Continued)

OTHER PUBLICATIONS

Kedzierski et al., "High-Performance Symmetric-Gate and CMOS-Compatible Vt Asymmetric-Gate FinFET Devices", International Electron Devices Meeting 2001, IEDM Technical Digest. Washington DC, Dec. 2-5, 2001, New York, NY: IEEE, pp. 1951-1954, XP010575161.

(Continued)

Primary Examiner — Matthew E Warren
Assistant Examiner — John Lin
(74) Attorney, Agent, or Firm — McDermott Will & Emery LLP

(57) ABSTRACT

A semiconductor device includes: a semiconductor substrate in which a trench is formed; a source region and a drain region each of which is buried in the trench and contains an impurity of the same conductive type; a semiconductor FIN buried in the trench and provided between the source and drain regions; a gate insulating film provided on a side surface of the semiconductor FIN as well as the upper surface of the semiconductor FIN; and a gate electrode formed on the gate insulating film.

20 Claims, 21 Drawing Sheets

U.S. PATENT DOCUMENTS

| | | | |
|---|---|---|---|
| 5,612,230 | A | 3/1997 | Yuzurihara et al. |
| 6,025,628 | A * | 2/2000 | Lee et al. .................. 257/339 |
| 6,288,431 | B1 * | 9/2001 | Iwasa et al. ................ 257/401 |
| 6,413,802 | B1 | 7/2002 | Hu et al. |
| 6,770,516 | B2 * | 8/2004 | Wu et al. .................. 438/154 |
| 6,787,854 | B1 * | 9/2004 | Yang et al. ................ 257/348 |
| 7,163,851 | B2 * | 1/2007 | Abadeer et al. ........... 438/157 |
| 2002/0003256 | A1 | 1/2002 | Maegawa |
| 2002/0011612 | A1 | 1/2002 | Hieda |
| 2002/0036290 | A1 | 3/2002 | Inaba et al. |
| 2002/0125536 | A1 | 9/2002 | Iwasa et al. |

FOREIGN PATENT DOCUMENTS

| | | |
|---|---|---|
| JP | 62-076734 | 4/1987 |
| JP | 63-131565 | 6/1988 |
| JP | 05-110083 | 4/1993 |
| JP | 05-167043 | 7/1993 |
| JP | 06-302818 | 10/1994 |
| JP | 11-68069 | 3/1999 |
| JP | 2002-110963 | 4/2002 |
| JP | 2002-118255 | 4/2002 |

OTHER PUBLICATIONS

Japanese Notice of Reasons for Rejection, with English translation thereof, issued in Japanese Patent Application No. 2006-507677, mailed on Jan. 18, 2011.

* cited by examiner

FIG. 11
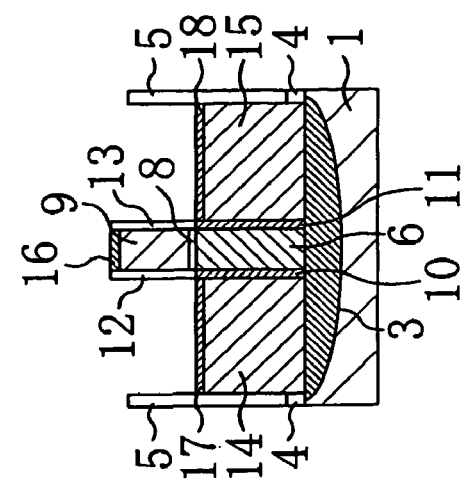
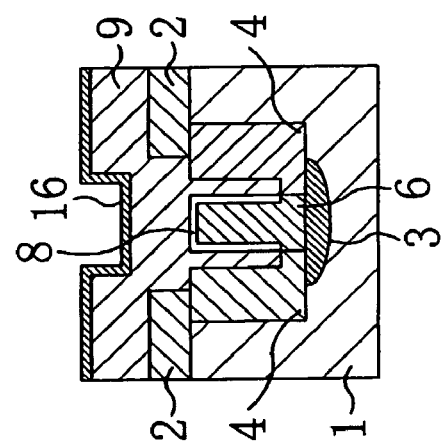
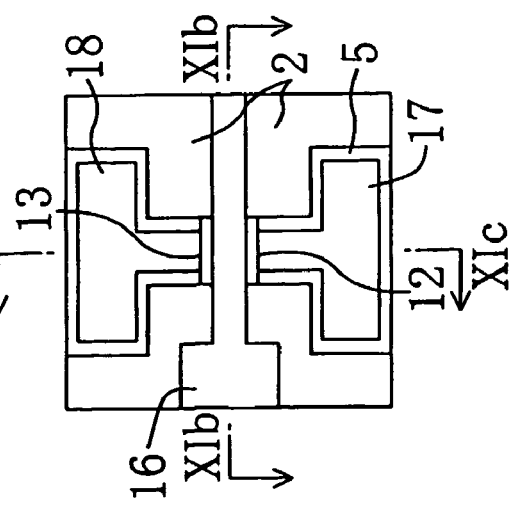

FIG. 19
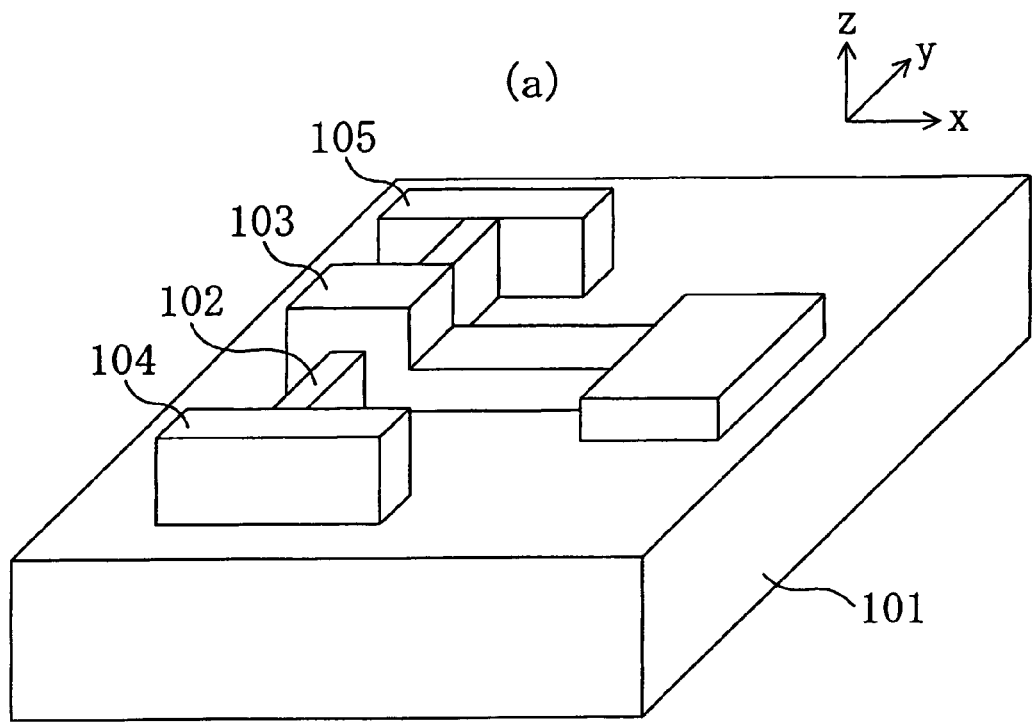
(a)
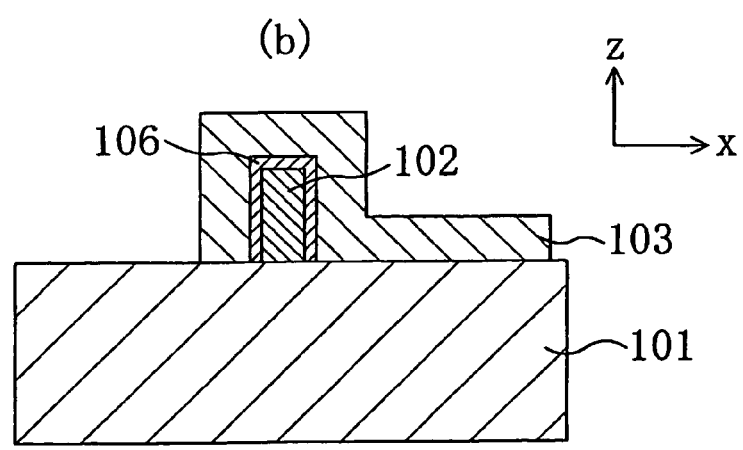
(b)

FINFET-TYPE SEMICONDUCTOR DEVICE AND METHOD FOR FABRICATING THE SAME

This application is the U.S. National Phase under 35 U.S.C. §371 of International Application No. PCT/JP2004/003808, filed Mar. 19, 2004, which in turn claims the benefit of Japanese Application No. 2003-078002, filed Mar. 20, 2003, the disclosures of which applications are incorporated by reference herein in their entirety.

TECHNICAL FIELD

The present invention relates to double-gate MOS field-effect transistors, and more particularly, the present invention relates to a FINFET having a gate electrode on a side or upper surface of a fin-shaped semiconductor layer.

BACKGROUND ART

In recent years, as one of means for improving the performance of semiconductor devices having a MOS structure, FINFETs, obtained by forming a convex semiconductor layer having a fin shape on a substrate and then forming a gate electrode on a side or upper surface of the semiconductor layer to form a channel region, have been proposed.

For example, a known FINFET is disclosed in J. Kedzierski et al., *IEDM Technical Digest* pp. 437-440 (2001) (which will be hereinafter referred to as Reference 1).

FIGS. 19(a) and 19(b) are perspective and cross-sectional views illustrating the known FINFET, respectively. As shown in FIGS. 19(a) and 19(b), in the known FINFET, a thin silicon FIN 102 having a thickness of about 20 nm (in the x-axis direction) is formed on a BOX (buried oxide film) 101, i.e., an SOI substrate, so as to be elongate (in the y-axis direction), a gate electrode 103 made of polysilicon is formed so as to lay across the silicon FIN 102 with a gate oxide film 106 interposed between the silicon FIN 102 and the gate electrode 103, and then a source pad 104 and a drain pad 105 are formed.

The FINFET has a double-gate structure in which a gate voltage can be applied from both sides of the silicon FIN shown in FIG. 19(b). Accordingly, in the FINFET, improvement of cutoff properties, suppression of the short channel effect and the like are achieved. Therefore, the FINFET is considered to be effective means for solving problems which arise when the gate length of a MOSFET is reduced.

Moreover, for example, in Reference 1, modified structures of the above-described FINFET are proposed. For example, some structures in which by forming a FIN on a silicon substrate to allow application of a substrate bias, deterioration of the source-drain breakdown voltage due to influence of accumulated holes (in the case of an n-channel FET) which may possibly occur in a fully depleted transistor on an SOI substrate can be suppressed are disclosed in Reference 1.

The structures proposed therein include a structure which is characterized in that an insulating film having an opening portion is formed on a semiconductor substrate and a FIN and a gate electrode are formed in the opening portion and can be fabricated in a simple manner.

FIG. 20(a) is a plan view of an example of the known FINFET disclosed in Reference 1 when the example is viewed from the top. FIG. 20(b) is a cross-sectional view taken along the line XXb-XXb shown in FIG. 20(a). FIG. 20(c) is a cross-sectional view taken along the line XXc-XXc shown in FIG. 20(a).

The known FINFET includes a p-type Si substrate 201 having an active region, source and drain regions 209 and 210 each of which is provided on the active region of the p-type Si substrate 201 and made of a semiconductor containing an n-type impurity, and an LDD regions 208 which are provided so as to be in contact with the source and drain regions 209 and 210, respectively, to face each other and to contain an n-type impurity at a lower concentration than that in the source and drain regions 209 and 210, a convex Si FIN 203 provided on part of the active region of the p-type Si substrate 201 located between the source and drain regions 209 and 210, a gate oxide film 204 provided on side surfaces of the Si FIN 203 as well as the upper surface of the Si FIN 203, a first gate electrode 205 provided on the gate oxide film 204, a second gate electrode 206 provided on the first gate electrode 205, an insulating film 202 which surrounds the active region and is made of $SiO_2$, a gate side wall insulating film 207 provided on a side wall of the first gate electrode 205, an interlevel insulating film 211 provided over the second gate electrode 206, the source region 209 and the drain region 210, and a contact plug 212 which passes through the interlevel insulating film 211 to reach the source region 209 or the drain region 210.

As for methods for forming a FIN, a method in which a FIN is formed by removing the p-type Si substrate 201 by etching, a method in which a FIN is epitaxially grown in a region of the p-type Si substrate 201 corresponding to the opening portion of the insulating film 202, and like method are disclosed.

Problems to be Solved

However, a FINFET formed in any one of the above-described manners has a problem of poor surface evenness when the entire substrate is viewed.

FIG. 21 is a cross-sectional view illustrating a semiconductor device in which a known planar MOSFET and the known FINFET are mounted together. When the known FINFET and the known planar MOSFET are mounted together as shown in FIG. 21, there may be cases where a gap between steps in a substrate is increased, thus resulting in an inconvenience in which process steps can not be uniformed. The left-hand side of FIG. 21 shows the FINFET shown in FIGS. 20(a) through 20(c) and the right-hand side of FIG. 21 shows a planar MOSFET including a source region 309, a drain region 310, an LDD region 308, a first gate electrode 305, a second gate electrode 306, a source electrode 313, a drain electrode 314, a gate side wall insulating film 307 and a gate insulating film 315.

As has been described, in order to fully utilize the performance of a FINFET in electronic equipment, it has been necessary to simplify integration of the FINFET and a planar MOSFET.

It is therefore an object of the present invention to provide a FINFET which can be integrated with a planar MOSFET in a simple manner.

DISCLOSURE OF INVENTION

A first semiconductor device according to the present invention includes: a semiconductor substrate in which a trench is formed; a source region and a drain region each of which is buried in the trench and contains an impurity of the same conductive type; a semiconductor FIN buried in the trench and provided between the source region and the drain region; a gate insulating film provided on a side surface of the semiconductor FIN as well as an upper surface of the semiconductor FIN; and a gate electrode provided on the gate insulating film.

In this structure, the semiconductor FIN, the source region and the drain region are provided in the trench. Thus, evenness of the upper surface of the substrate can be improved, compared to that of a known semiconductor device. Accordingly, the inventive semiconductor device can be mounted with a planar MOSFET in a simple manner. Moreover, a protruding portion of the substrate is hardly damaged, resulting in an improved yield.

The semiconductor FIN is preferably made of one material selected from the group consisting of Si, $Si_{1-x}Ge_x(0<x\leq1)$, and $Si_{1-y-z}Ge_yC_z(0<y<1, 0<z<1, 0<y+z<1)$. When Si is used, a highly reliable semiconductor device can be achieved at low costs. When SiGe or SiGeC is used, it is possible to increase mobility to a higher level than in the case where Si is used, so that the performance of the semiconductor device can be improved.

The gate electrode is provided on the gate insulating film so as to extend over the semiconductor substrate, an isolation insulating film is further provided between part of the semiconductor substrate located in a side wall portion of the trench and part of the gate electrode located over the side wall of the semiconductor FIN; and an insulating film is further provided between part of the semiconductor substrate in which the trench is not formed and the gate electrode.

With this structure, the gate insulating film, the isolation insulating film and the insulating film can be formed in different process steps, respectively. Thus, the thicknesses of the isolation insulating film and the insulating film can be appropriately changed so that the gate electrode and the semiconductor substrate can be reliably insulated from each other.

The gate electrode is provided on the gate insulating film so as to extend over the semiconductor substrate, the gate insulating film is provided on the side and upper surfaces of the semiconductor FIN as well as part of the semiconductor substrate in which the trench is not formed, and part of the gate insulating film located on the part of the semiconductor substrate in which the trench is not formed is interposed between the semiconductor substrate and the gate electrode.

In this structure, the gate insulating film functions as an insulating film for insulating the gate electrode and the semiconductor substrate from each other. Therefore, each of the insulating films does not have to form in a separate process step, so that the number of the process steps can be reduced.

The semiconductor FIN is preferably formed so as to have a convex shape in view of suppressing the short channel effect.

A second semiconductor device according to the present invention includes: a first field-effect transistor including a semiconductor substrate in which a trench is formed, a first source region and a first drain region each of which is buried in the trench and contains an impurity of the same conductive type, a semiconductor FIN buried in the trench and provided between the first source region and the first drain region, a first gate insulating film provided on a side surface of the semiconductor FIN as well as an upper surface of the semiconductor FIN, and a first gate electrode formed on the first gate insulating film; and a second field-effect transistor including a second gate insulating film provided on the semiconductor substrate, a second gate electrode provided on the second gate insulating film, and second source and drain regions each of which contains an impurity and is provided in a region of the semiconductor substrate located on a side of and under the second gate electrode.

In this structure, the height of a substrate surface in part of the substrate in which the first gate electrode of the first field-effective transistor is provided and the height of a substrate surface in part of the substrate in which the second gate electrode of the second filed-effect transistor is provided can be made the same, and the heights of upper surfaces of the first source region and the first drain region and the heights of upper surfaces of the second source region and the second drain region can be made the same. This makes it possible to form members including these electrodes in the same process step.

The first gate electrode is provided on the first gate insulating film so as to extend over the semiconductor substrate, and the first field-effect transistor further includes an isolation insulating film formed between part of the semiconductor substrate located in a side wall portion of the trench and part of the first gate electrode provided over the side surface of the semiconductor FIN and an insulating film formed between the semiconductor substrate and the first gate electrode. Thus, by changing the thickness of the isolation insulating film according to a supply voltage and the like, the breakdown voltage can be ensured in a simple manner in the first filed-effect transistor.

The first gate electrode is provided on the first gate insulating film so as to extend over the semiconductor substrate, the first gate insulating film is provided on the side and upper surfaces of the semiconductor FIN as well as part of the semiconductor substrate in which the trench is not formed, and part of the gate insulating film located on the part of the semiconductor substrate in which the trench is not formed is interposed between the semiconductor substrate and the first gate electrode. Thus, the gate insulating film, the isolation insulating film and the insulating film can be formed as one unit. Therefore, the number of the fabrication process steps can be reduced.

A method for fabricating a semiconductor device according to the present invention is a method for fabricating a semiconductor device including a semiconductor substrate in which a trench is formed, a source region and a drain region each of which is buried in the trench and contains an impurity of the same conductive type, a semiconductor FIN buried in the trench and provided between the source and drain regions, a gate insulating film provided on a side surface of the semiconductor FIN as well as an upper surface of the semiconductor FIN, and a gate electrode formed on the gate insulating film, and includes steps of: (a) forming a semiconductor layer in the trench formed in the semiconductor substrate; (b) forming a gate insulating film on an upper surface of part of the semiconductor layer which is to be the semiconductor FIN as well as a side surface of the part of the semiconductor layer; (c) forming a gate electrode on the gate insulating film; and (d) introducing an impurity into the semiconductor layer, using the gate electrode as a mask, to form a source region and a drain region in regions of the semiconductor layer located on sides of and under the gate electrode, respectively, and then forming a semiconductor FIN in a region of the semiconductor layer interposed between the source region and the drain region and located directly under the gate electrode.

With this method, a semiconductor device which includes source and drain regions and a semiconductor FIN buried in a trench and of which substrate surface is more even than that of a known device can be fabricated.

In the process step (c), the gate electrode is provided on the gate insulating film so as to extend over the semiconductor substrate, and the method further includes the step (e) of forming an isolation insulating film in a side wall portion of the trench and the step (f) of forming an insulating film on the semiconductor substrate. Thus, the thickness of the gate voltage can be changed according to a gate voltage in the steps (e) and (f). Therefore, the breakdown voltage can be ensured in a simple manner.

The gate electrode is provided on the gate insulating film so as to extend over the semiconductor substrate, the gate insulating film formed in the step (b) is provided on side and upper surfaces of part of the semiconductor layer which is to be the semiconductor FIN as well as part of the semiconductor substrate in which the trench is not formed, and in the step (c), the gate electrode is provided so that the gate insulating film is interposed between the part of the gate electrode and the semiconductor substrate. Thus, the number of the fabrication process steps can be reduced, resulting in reduction in fabrication costs.

BRIEF DESCRIPTION OF DRAWINGS

FIG. 11(a) is a plan view illustrating respective steps for fabricating the FINFET of the first embodiment; and FIGS. 11(b) and 11(c) are cross-sectional views illustrating respective steps for fabricating the FINFET.

FIGS. 19(a) and 19(b) are perspective and cross-sectional views illustrating a known FINFET, respectively.

BEST MODE FOR CARRYING OUT THE INVENTION

First Embodiment

Hereinafter, a first embodiment of the present invention will be described with reference to the accompanying drawings.

Figure 1:
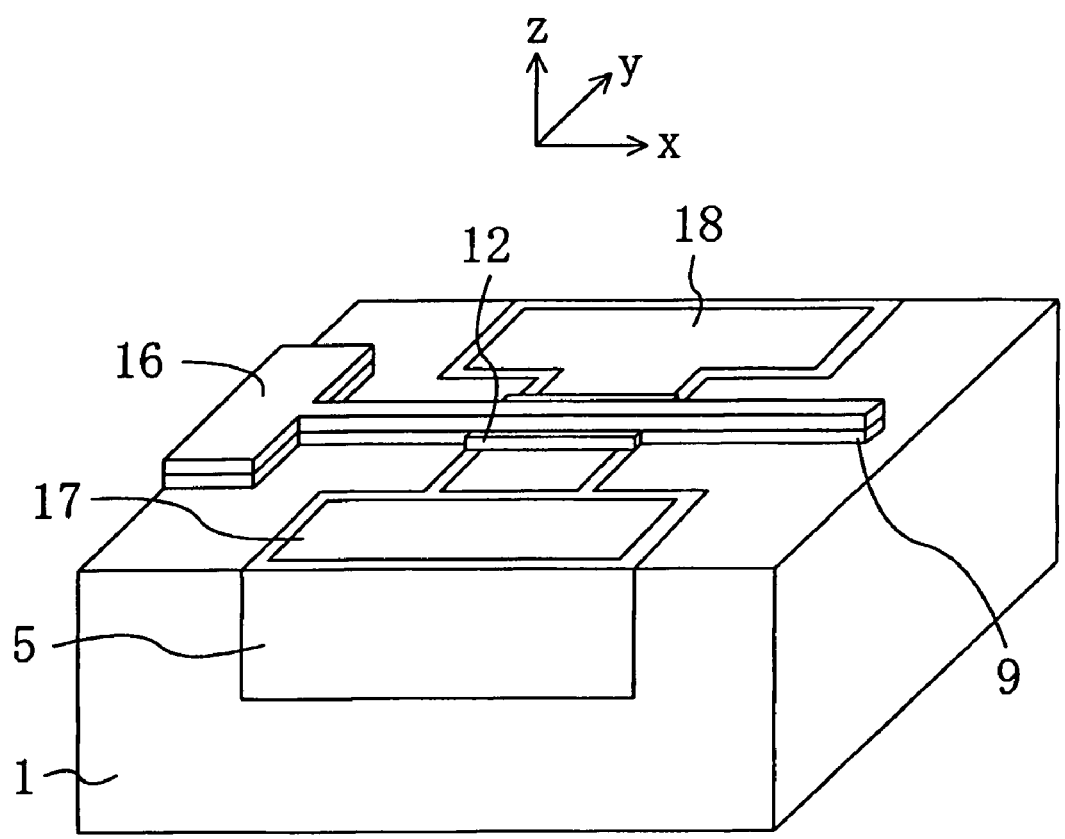
FIG. 1 is a perspective view of a FINFET according to a first embodiment of the present invention.

FIG. 1 is a perspective view of a FINFET according to the first embodiment. FIG. 11(a) is a plan view of the FINFET of the first embodiment. FIG. 11(b) is a cross-sectional view of the FINFET taken along the line XIb-XIb shown in FIG. 11(a). FIG. 11(c) is a cross-sectional view of the FINFET taken along the line XIc-XIc shown in FIG. 11(a).

As shown in FIGS. 11(a) through 11(c), the FINFET of this embodiment includes: a p-type well 1 which is provided in a semiconductor substrate made of Si or the like and in which a trench is formed; source and drain regions 14 and 15 each of which is buried in the trench of the p-type well 1 and contains an n-type impurity; a source-LDD region 10 which is provided so as to be in contact with the source region 14 and contains an n-type impurity at a lower concentration than that in the source region 14; a drain-LDD region 11 which is provided so as to be in contact with the drain region 15 and contains an n-type impurity at a lower concentration than that in the drain region 15; a convex semiconductor FIN 6 buried in the trench of the p-type well 1 and provided between the source region 14 and the drain region 15 (i.e., between the source-LDD region 10 and the drain-LDD region 11); a gate insulating film 8 provided on side surfaces of the semiconductor FIN 6 as well as the upper surface of the semiconductor FIN 6 and made of $SiO_2$ or the like; a first gate electrode 9 provided on the gate insulating film 8 so as to extend over a portion of the p-type well 1 in which the trench is not formed and made of, for example, polysilicon; a second gate electrode 16 provided on the first gate electrode 9 and made of, for example, titanium silicide; an isolation insulating film 4 which is provided in the trench of the p-type well 1 and surrounds the semiconductor FIN 6 and the first gate electrode 9; a first insulating film 5 provided on side surfaces of the source region 14 and the drain region 15 and made of SiO$_2$ or the like; a second insulating film 2 provided at least in a region of the substrate in which the trench is not formed and which is located between the p-type well 1 and the first gate electrode 9; gate side wall insulating films 12 (source side) and 13 (drain side) provided on both sides of the first gate electrode 9, respectively; a source electrode 17 provided on the source region 14 and made of, for example, titanium silicide; and a drain electrode 18 provided on the drain region 15 and made of, for example, titanium silicide. Moreover, a heavily doped impurity region 3 to serve as a channel stopper layer containing a p-type impurity at a concentration of about 5×10$^{17}$ cm$^3$ is provided in part of the p-type well 1 located at a bottom portion of the trench, i.e., part of the p-type well 1 located under the source region 14, the drain region 15 and the semiconductor FIN 6.

The semiconductor FIN 6 may be made of, for example, silicon epitaxially grown, Si$_{1-x}$Ge$_x$ (0<x≦1), or Si$_{1-y-z}$Ge$_y$C$_z$ (0<y<0, 0<z<1, 0<y+z<1).

Moreover, the concentration of the impurity contained in the p-type well 1 is, for example, about 5×10$^{15}$ cm$^{-3}$. The concentration of the impurity contained in the source region 14 and the drain region 15 is, for example, about 4×10$^{20}$ cm$^{-3}$. Moreover, the concentration of the impurity contained in the semiconductor FIN 6 is, for example, about 5×10$^{17}$ cm$^{-3}$ to 5×10$^{18}$ cm$^{-3}$.

In an exemplary design in which the semiconductor FIN 6 is made of Si, the semiconductor FIN 6 has a thickness of about 20 nm in the x direction (i.e., the gate width direction) shown in FIG. 1 and a height of about 200 nm in the z direction (i.e., the height direction) shown in FIG. 1. Moreover, the thickness of the gate insulating film 8 is about 2 nm, the thickness of part of the first gate electrode 9 located on a side of the semiconductor FIN 6 is about 75 nm, the thickness of the isolation insulating film 4 for isolating the part of the first gate electrode 9 located on a side of the semiconductor FIN 6 and the p-type well 1 from each other is 150 nm.

A feature of the FINFET of this embodiment is that the semiconductor FIN 6 is buried in the trench of the p-type well 1 together with the source region 14 and the drain region 15. Accordingly, surface unevenness of a substrate is smaller in the FINFET of this embodiment than that of the known FINFET shown in FIGS. 19(a) and 19(b) and FIG. 21. Therefore, as will be described later, the FINFET of this embodiment can be mounted together with a planar semiconductor device in a simple manner.

Figure 12:
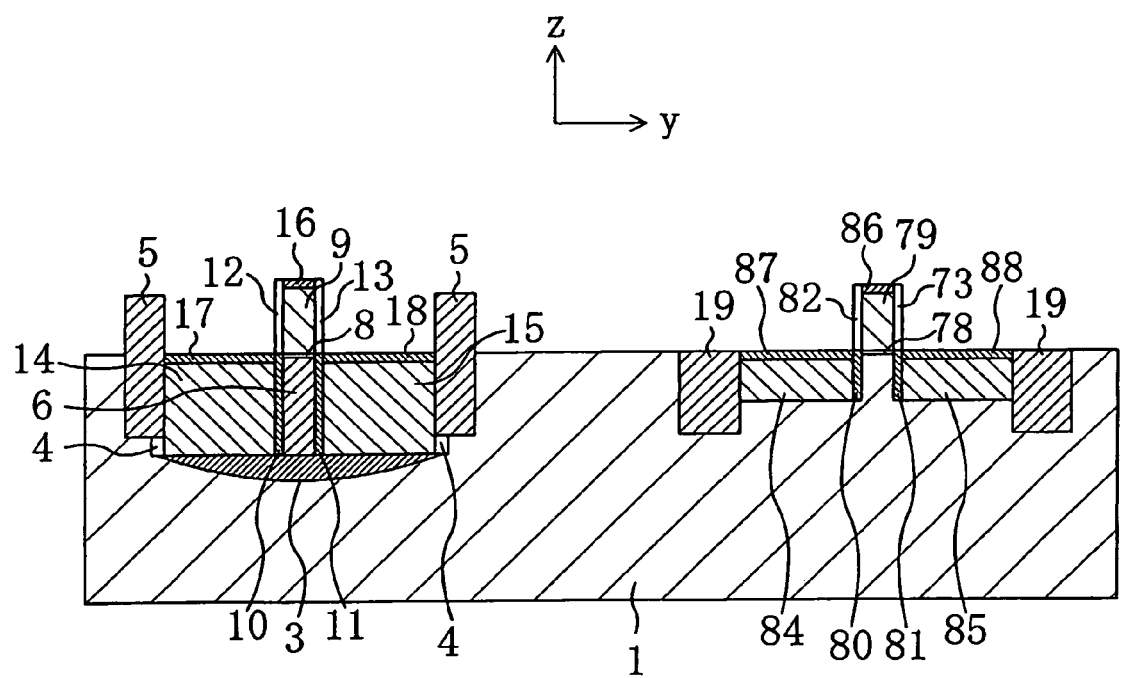
FIG. 12 is a cross-sectional view illustrating a semiconductor device in which the FINFET of the first embodiment of the present invention and a planar MOSFET are integrated on the same substrate.
Figure 13:
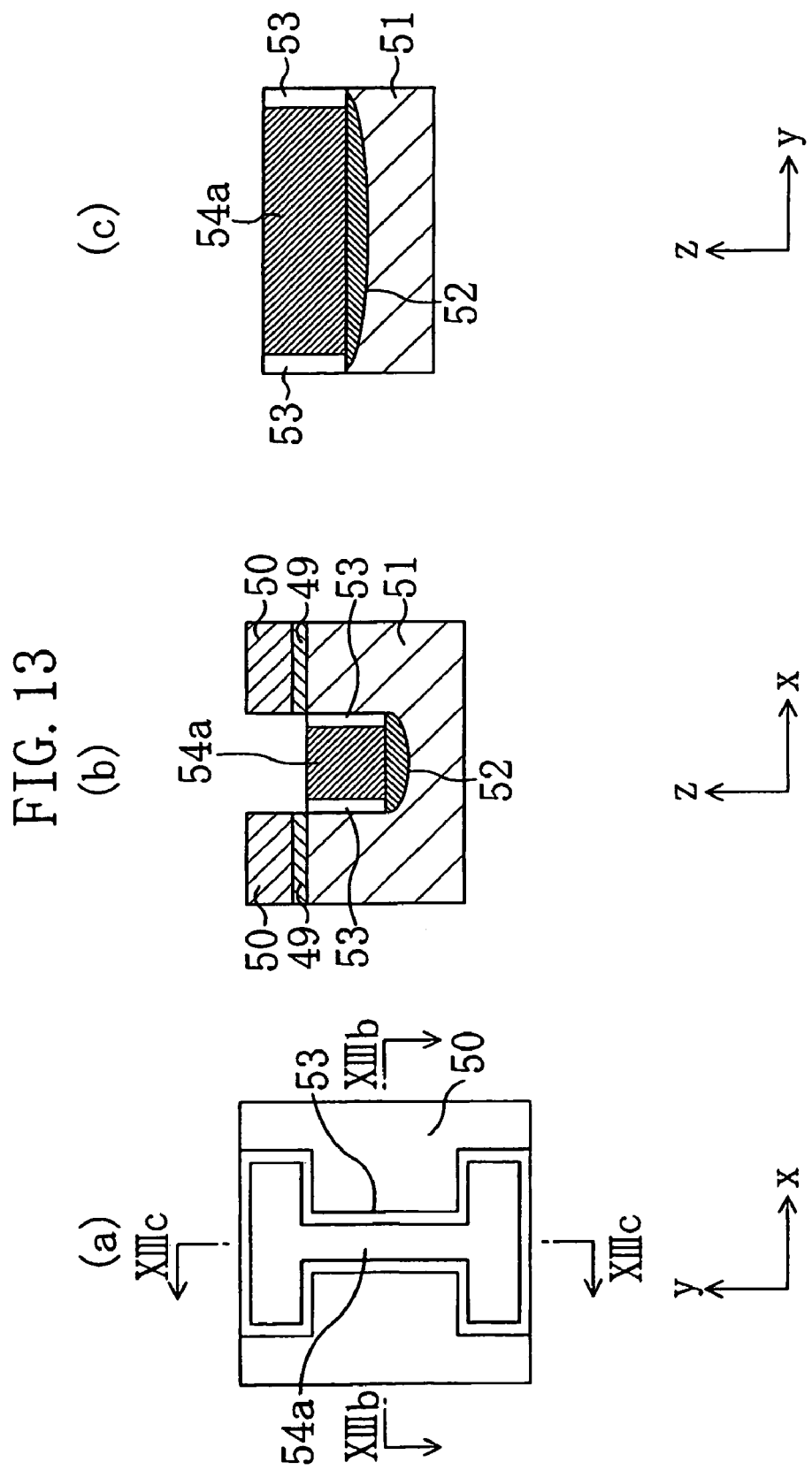
FIG. 13(a) is a plan view illustrating respective steps for fabricating the FINFET of a second embodiment of the present invention.
FIGS. 13(b) and 13(c) are cross-sectional views illustrating respective steps for fabricating the FINFET.
Figure 14:
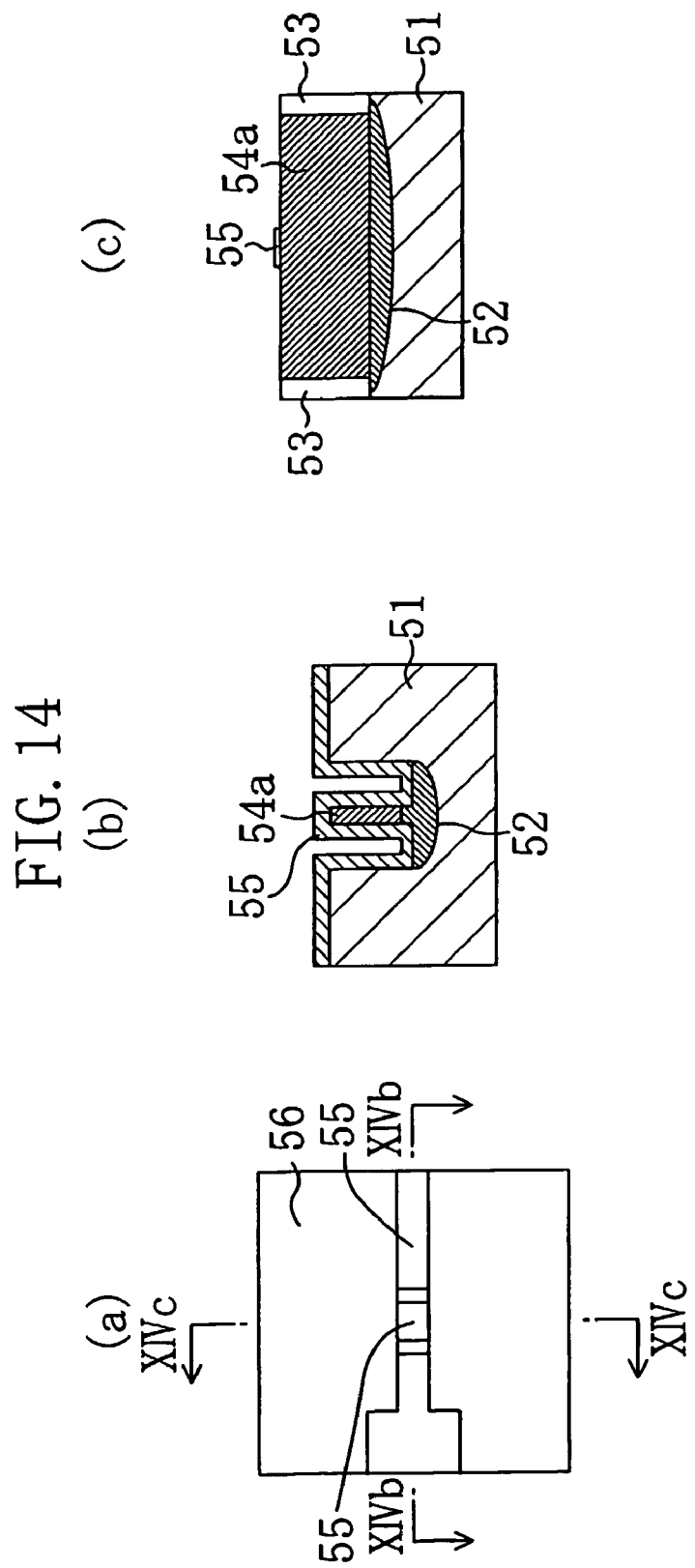
FIG. 14(a) is a plan view illustrating respective steps for fabricating the FINFET of the second embodiment.
FIGS. 14(b) and 14(c) are cross-sectional views illustrating respective steps for fabricating the FINFET.
Figure 15:
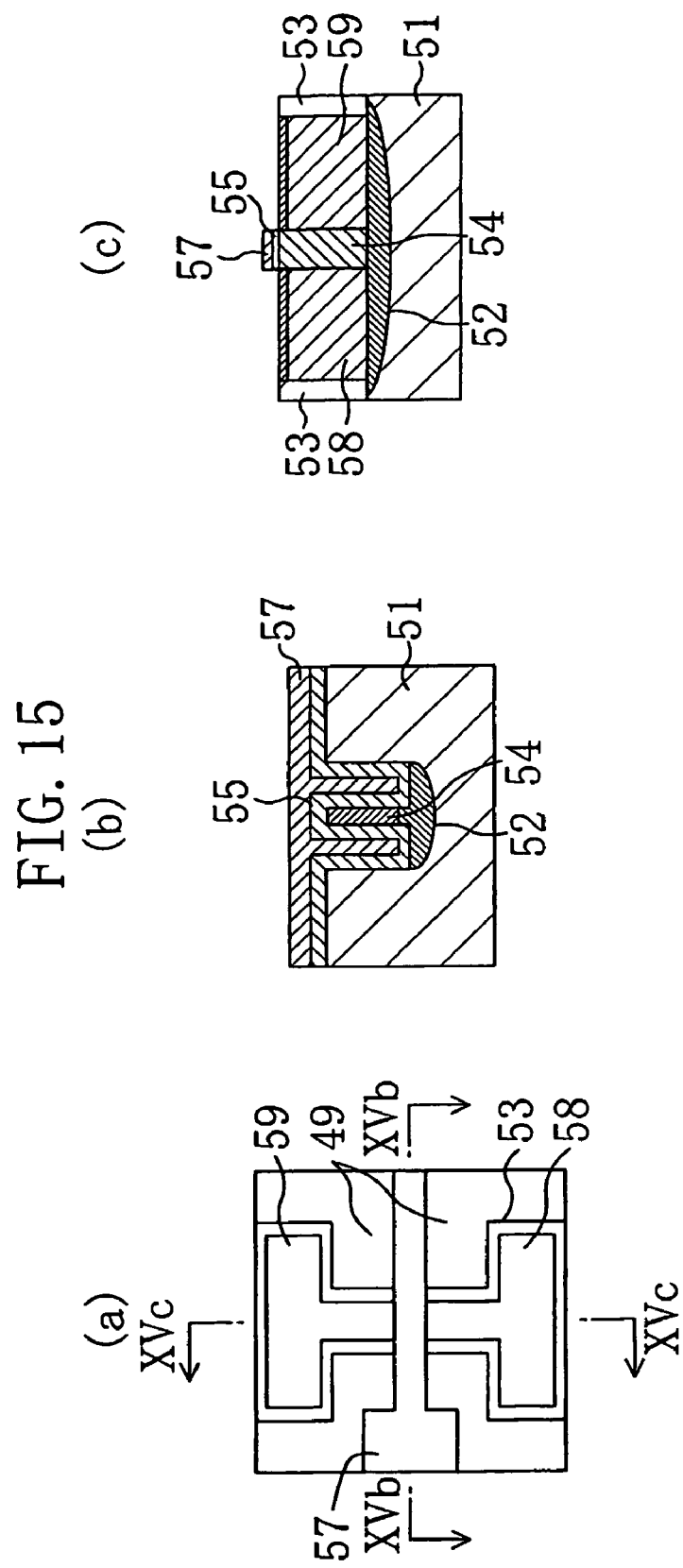
FIG. 15(a) is a plan view illustrating respective steps for fabricating the FINFET of the second embodiment.
FIGS. 15(b) and 15(c) are cross-sectional views illustrating respective steps for fabricating the FINFET.
Figure 16:
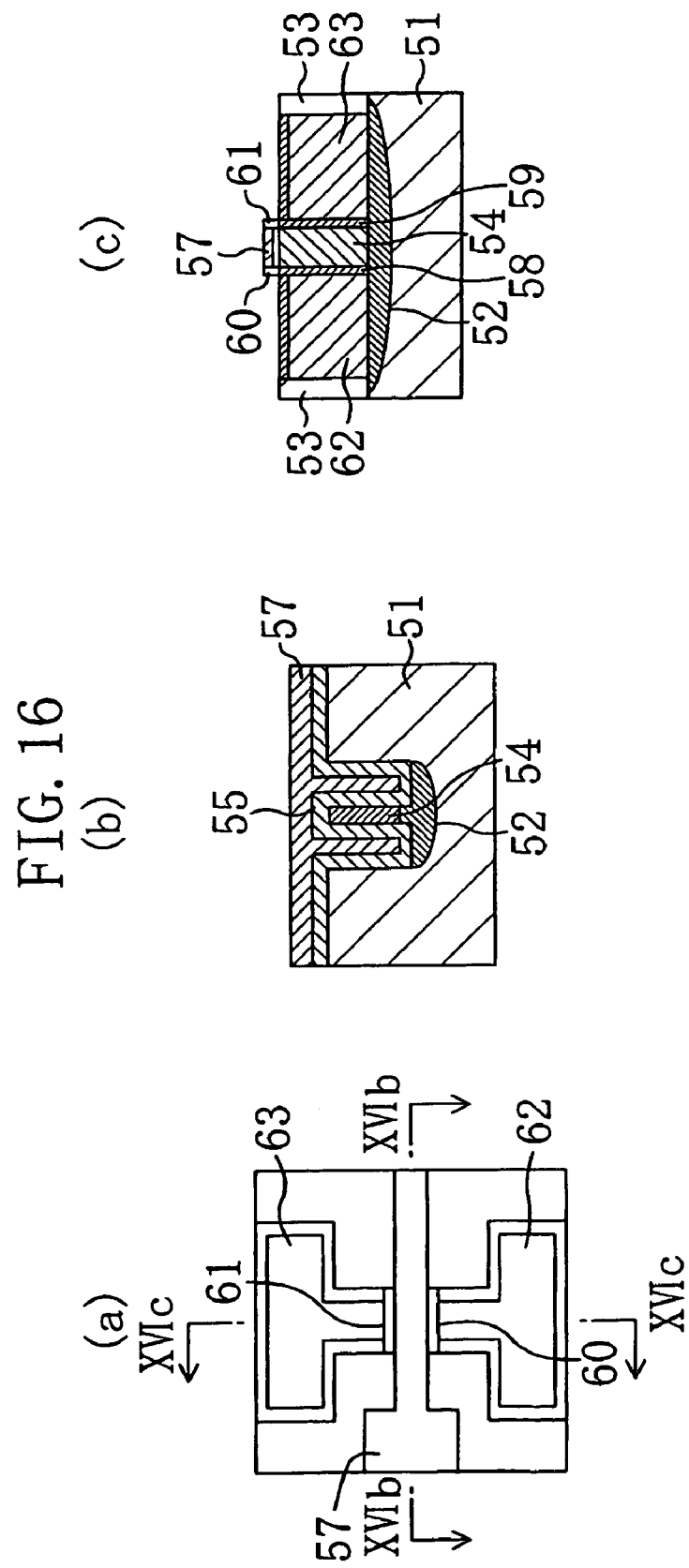
FIG. 16(a) is a plan view illustrating respective steps for fabricating the FINFET of the second embodiment.
FIGS. 16(b) and 16(c) are cross-sectional views illustrating respective steps for fabricating the FINFET.

FIG. 12 is a cross-sectional view illustrating a semiconductor device in which the FINFET of this embodiment and a planar MOSFET are integrated on the same substrate. In FIG. 12, a FINFET shown in the left-hand side is the same FINFET shown in FIGS. 11(a) through 11(c) and each member also shown in FIGS. 11(a) through 11(c) is identified by the same reference numeral. In this case, a planar MOSFET shown in the right-hand side of FIG. 12 includes: a gate insulating film 78 provided on a p-type well (or a semiconductor substrate) 1; a first gate electrode 79 provided on the gate insulating film 78; a second gate electrode 86 provided on the first electrode 79; source and drain regions 84 and 85 each of which provided in a region of the p-type well 1 located on a side of and under the first gate electrode 79; a source electrode 87 provided on the source region 84; a drain electrode 88 provided on the drain region 85; a isolation insulating film 19 buried in the p-type well 1.

Figure 21:
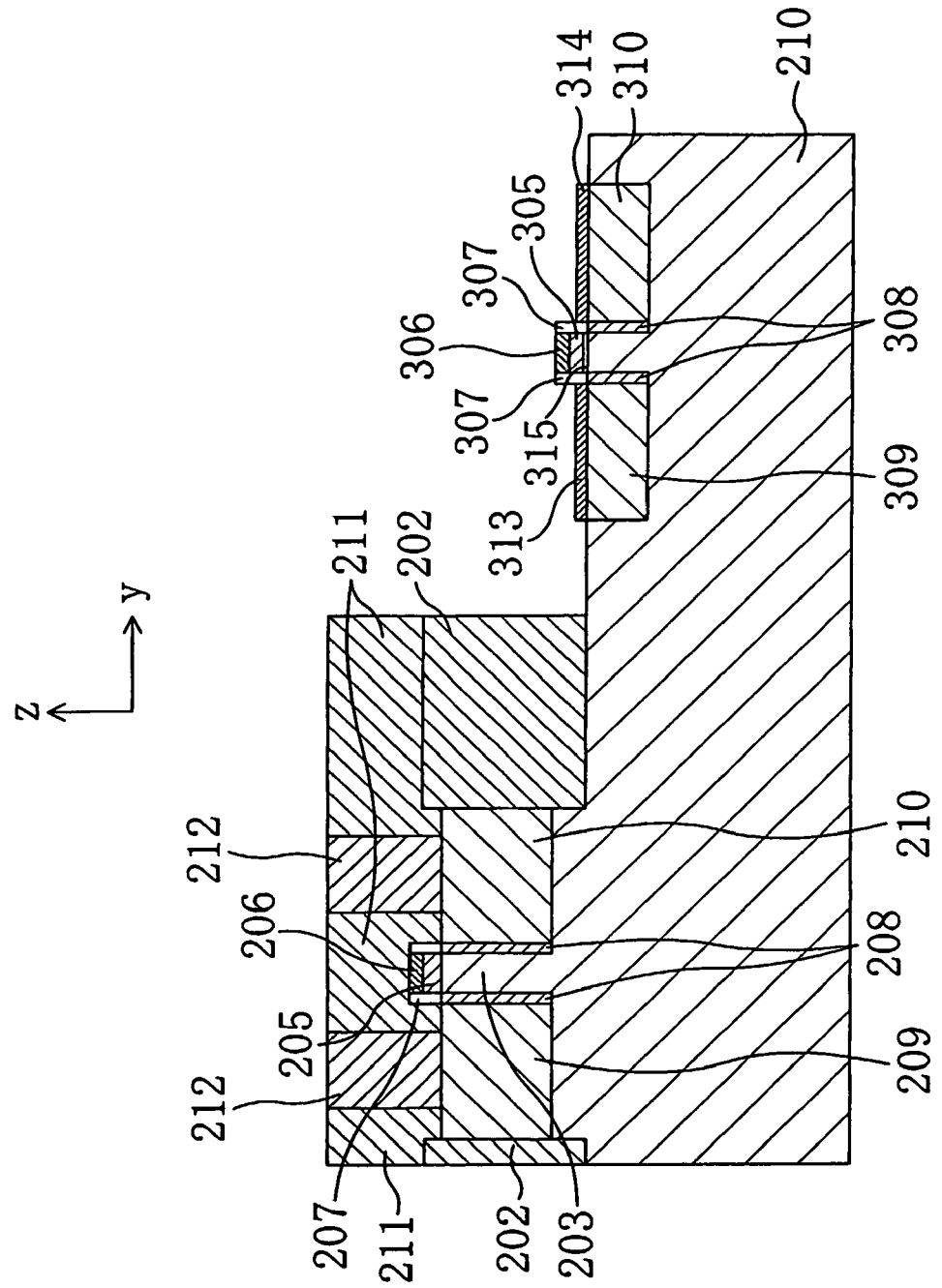
FIG. 21 is a cross-sectional view illustrating a semiconductor device in which an FINFET according to the known example and a planar MOSFET are integrated on the same substrate.

As can be seen from comparison between the FIGS. 12 and 21, in the semiconductor device of this embodiment, the height of the substrate surface in a region of the substrate in which the FINFET is formed and the height of the substrate surface in a region of the substrate in which the planar MOSFET is formed can be made the same. More specifically, in this embodiment, the source region 14, the drain region 15 and the semiconductor FIN 6 are buried in the p-type well 1. Accordingly, the height of a substrate surface in regions of the substrate in which the source electrode 17 and drain electrode 18 of the FINFET are provided and the height of a substrate surface in regions of the substrate in which the source 17 and drain electrode 18 of the MOSFET are provided can be made the same. Thus, in the FINFET of this embodiment, the heights of regions of the substrate in which members such as the source electrode and the drain electrode can be made substantially the same. Accordingly, the process steps, such as the process step of forming a source/drain electrode and a gate electrode, used in fabricating a FINFET can be also used in fabricating a planar MOSFET. Therefore, a semiconductor device in which a FINFET and a planar MOSFET are integrated can be fabricated in a more simple manner than in the case of the known FINFET. Moreover, the known FINFET has many portions protruding from a substrate surface, and in many cases, a device is damaged in fabrication process steps. However, the FINFET of this embodiment has improved surface evenness, resulting in an improved yield. Furthermore, a more even substrate surface than that of known device can be obtained, so that the process step of forming an interconnect can be performed in a simple manner.

Next, an exemplary method for fabricating a FINFET according to the first embodiment will be described with reference to the accompanying drawings.

FIGS. 2 through 11 are cross-sectional views illustrating respective steps for fabricating the FINFET of this embodiment. In each of FIGS. 2 through 11, (a) is a plan view of the FINFET viewed from the top; (b) is a cross-sectional view of the FINFET in the lateral direction (i.e., the x direction) shown in (a); and (c) is a cross-sectional view of the FINFET in the longitudinal direction (i.e., the y direction) shown in (a). Note that the x, y and z directions in this case are the same as those shown in FIG. 1.

First, in the process steps shown in FIGS. 2(a) through 2(c), a semiconductor substrate which is made of, for example, Si and in which a p-type well 1 is formed is prepared. Subsequently, a second insulating film 2, for example, which has a thickness of 300 nm and is made of SiO$_2$ is formed on the substrate and, using this as a mask, a region of the p-type well 1 in which a transistor is to be formed is removed by etching. Thus, a trench 100 is formed. In this case, the thickness of part of the trench (opening) 100 located in the p-type well 1 is about 200 nm. Next, for example, boron ions are implanted into the substrate and then annealing is performed thereto to form a p-type heavily doped impurity region 3 to serve as a channel stopper in part of the p-type well 1 located around a bottom portion of the trench 100.

Next, in the process steps shown in FIGS. 3(a) through 3(c), an inner wall portion of the trench 100 of the p-type well 1 is thermally oxidized, thereby forming an isolation insulating film 4. Furthermore, for example, SiO$_2$ or SiN is deposited over the substrate as well as a region of the substrate in which the trench 100 is formed. Thus, a first insulating film 5 is deposited so that the trench 100 is not completely filled.

In this case, in an exemplary design for part of the substrate in which a semiconductor FIN 6 is formed, the dimensions for part of the trench 100 in which a FIN is to be formed are as follows. The width in the x direction is 320 nm, the height in the z direction is 200 nm, the thickness of a side wall of the first insulating film 5 is 75 nm, and the thickness of a side wall of the isolation insulating film 4 is 150 nm. Moreover, the thickness of part of the first insulating film 5 located on the second insulating film 2 is about 100 nm. However, in the case of a size-reduced FINFET, the thickness of an isolation insulating film 4 is preferably 20 nm or more. With the thickness of 10 nm or more, breakdown voltage properties can be ensured.

Next, in the process steps shown in FIGS. 4(a) through 4(c), the first insulating film 5 and the isolation insulating film 4 are removed, by etching or the like, with side wall portions of the first insulating film 5 and the isolation insulating film 4 left, so that the heavily doped impurity region 3 is exposed.

Subsequently, in the process steps shown in FIGS. 5(a) through 5(c), for example, Si is epitaxially grown on the heavily doped impurity region 3 which has been made exposed in the previous process steps, thereby forming a semiconductor layer 6a in the trench 100. The semiconductor layer 6a is formed so as to have an H shape when viewed from the top and has regions to serve as source/drain pads and a portion corresponding part of the H shape having a small width. A portion of the semiconductor layer 6a having a small width is to be a semiconductor FIN 6 in a later process step.

Next, in the process steps shown in FIGS. 6(a) through 6(c), using as a mask a resist 7 having an opening in a region in which a first gate electrode 9 is to be formed, the first insulating film 5 is removed, so that parts of side and upper surfaces of part of the semiconductor layer 6a which is to be a semiconductor 6 are exposed.

Subsequently, in the process steps shown in FIGS. 7(a) through 7(c), exposed parts of the semiconductor layer 6a are oxidized to form a gate insulating film 8 which extends on side surfaces of the part to be the semiconductor FIN 6 as well as the upper surface of the part to be the semiconductor FIN 6 and is made of an $SiO_2$ film. In this case, the thickness of the gate insulating film 8 is, for example, about 2 nm.

Next, in the process steps shown in FIGS. 8(a) through 8(c), using the resist 7 as a mask, for example, polysilicon is deposited so as to be located over the part of the semiconductor layer 6a to be the semiconductor FIN 6 with the gate insulating film 8 interposed between the resist 7 and the part of the semiconductor layer 6a. Thus, the first gate electrode 9 is formed.

Subsequently, in the process steps shown in FIGS. 9(a) through 9(c), after the resist 7 has been removed, using the first gate electrode 9 as a mask, for example, phosphorus ions are implanted into the semiconductor layer 6a, thereby forming a source-LDD region 10 and a drain-LDD region 11 in parts of the substrate located on sides of and under the first gate electrode 9, respectively. In this case, each of the source-LDD region 10 and the drain-LDD region 11 are formed so as to partially overlap with an end portion of the first gate electrode 9 when viewed from the top. The concentration of phosphorus contained in the source-LDD region 10 and the drain-LDD region 11 is about $5\times10^{19}$ $cm^{-3}$.

Next, in the process steps shown in FIGS. 10(a) through 10(c), gate side wall insulating films 12 and 13 are formed on side surfaces of the first gate electrode 9, respectively. Thereafter, using the first gate electrode 9 and the gate side wall insulating films 12 and 13 as a mask, for example, phosphorus ions are implanted into the semiconductor layer 6a. Thus, a source region 14 and a drain region 15 are formed so that the first gate electrode 9 is interposed between the source region 14 and the drain region 15. The concentration of phosphorus contained in the source region 14 and the drain region 15 is about $4\times10^{20}$ $cm^{-3}$. Note that through these process steps and the process steps of forming LDD regions shown in FIGS. 9(a) through 9(c), part of the semiconductor layer 6a overlapping with the first gate electrode 9 (except for LDD regions) becomes a convex semiconductor 6.

Next, in the process steps shown in FIGS. 11(a) through 11(c), upper surface portions of the source region 14, the drain region 15 and the first gate electrode 9 are made into, for example, titanium silicide, to form a second gate electrode 16, a source electrode 17 and a drain electrode 18 on the first gate electrode 9, the source region 14 and the drain region 15, respectively. In this manner, the FINFET of FIG. 12 is formed.

According to the fabrication method of this embodiment, a FINFET which has an even substrate surface and in which the semiconductor FIN 6 is not protruding from the surface of the p-type well 1 (i.e., a silicon surface) can be formed. Accordingly, the FINFET can be integrated with a planar MOSFET in a simple manner. For example, a salicide process step shown in FIGS. 11(a) through 11(c), the process step of forming an interconnect, the process step of forming an interlevel insulating film and like step can be also used in a FINFET forming region and a planar MOSFET forming region.

Moreover, after the trench has been formed in the p-type well 1 and then the side wall has been formed, the semiconductor FIN 6 is epitaxially grown. Accordingly, the semiconductor FIN 6 having an even smaller width than an exposure limit can be formed in a simple manner. Moreover, in the FINFET of this embodiment, the semiconductor FIN 6 in an operation state is fully depleted, so that the short channel effect hardly occurs. Furthermore, the FINFET of this embodiment has advantageously a smaller substrate capacitance than that of a regular MOSFET.

Moreover, by forming a deep trench in the substrate, the semiconductor FIN 6 having a great height can be formed. Accordingly, a wide channel area can be obtained in a small area. Furthermore, even if the semiconductor FIN 6 is as tall as, for example, about 300-600 nm, each member is not damaged in fabrication process steps because the semiconductor FIN 6 is buried. Therefore, the FINFET can stably keep a constant shape. Furthermore, the p-type well 1 and the semiconductor FIN 6 are in contact with each other. Thus, a bias can be applied to the semiconductor FIN 6 via a stopper layer or a substrate, and also reduction in breakdown voltage due to accumulated holes which tends to occur in a fully depleted SOI device is not caused. Therefore, for the FINFET of this embodiment, an SOI substrate is preferably used as a Si substrate.

Note that in the FINFET of this embodiment, the gate insulating film 8, the isolation insulating film 4 and the second insulating film 2 are formed in different process steps, respectively. Therefore, it is possible to arbitrarily set the thickness of each of the isolation insulating film 4 and the second insulating film 2 to ensure required breakdown voltage properties.

Moreover, in the FINFET of this embodiment, the thickness of the gate insulating film 8 is substantially uniform in parts of the gate insulating film 8 provided in the side and upper surfaces of the semiconductor FIN 6. However, even if the part of the gate insulating film 8 provided on the upper surface of the semiconductor FIN 6 is made to have a larger thickness than that of the part of the gate insulating film 8 provided on the side surfaces of the semiconductor FIN 6, the FINFET of this embodiment can be operated as a double-gate FINFET.

Note that although only the structure of an n-channel FINFET has been described above, a p-channel FINFET can be formed in a similar manner.

Second Embodiment

Hereinafter, a FINFET according to a second embodiment of the present invention will be described with reference to the accompanying drawings.

Figure 17:
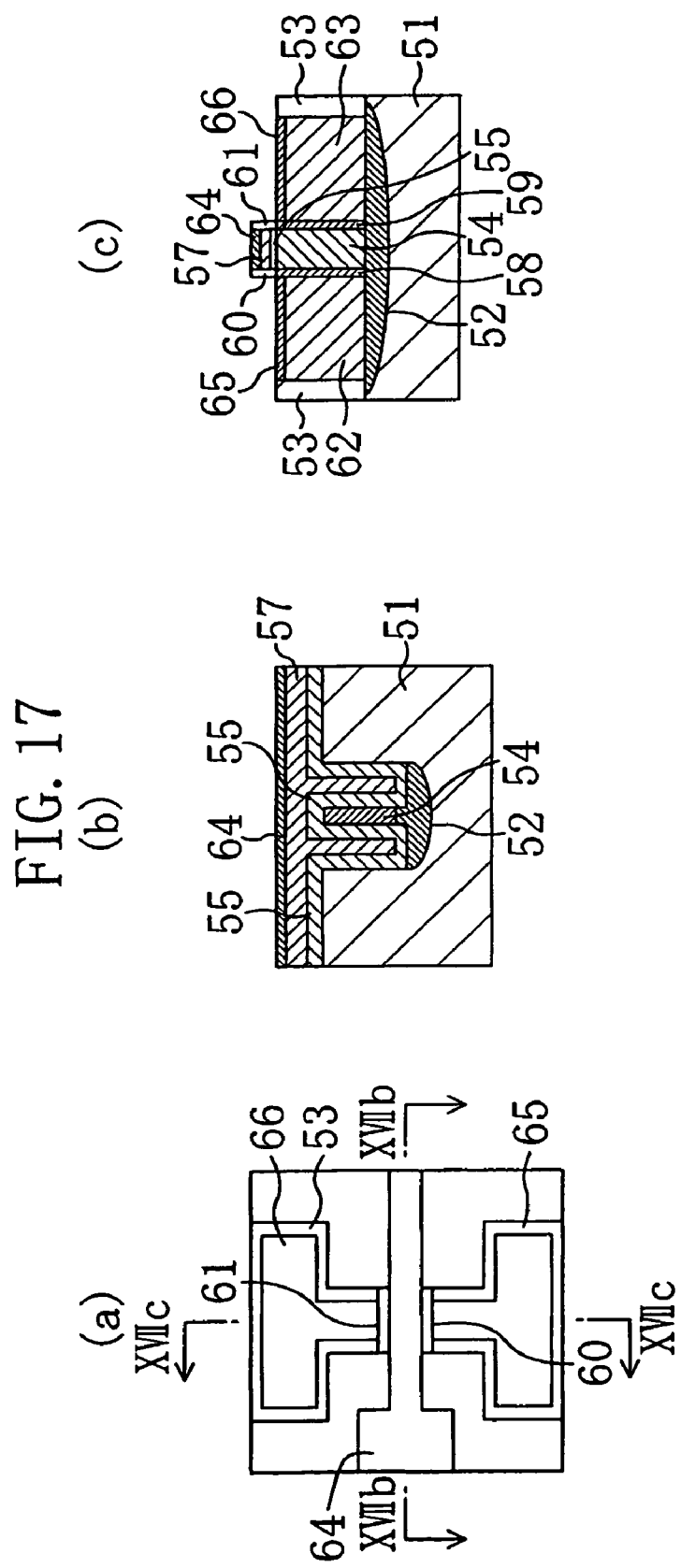
FIG. 17(a) is a plan view illustrating respective steps for fabricating the FINFET of the second embodiment.
FIGS. 17(b) and 17(c) are cross-sectional views illustrating respective steps for fabricating the FINFET.
Figure 18:
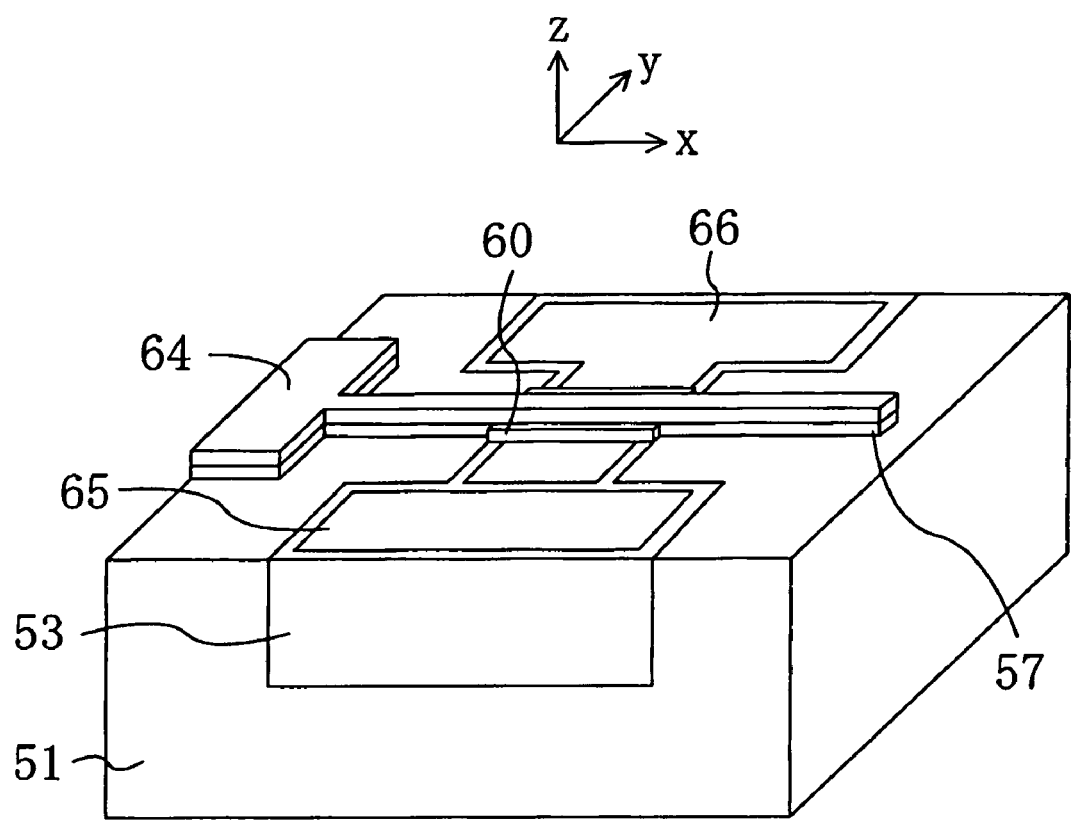
FIG. 18 is a perspective view illustrating the FINFET of the second embodiment of the present invention.
Figure 20:
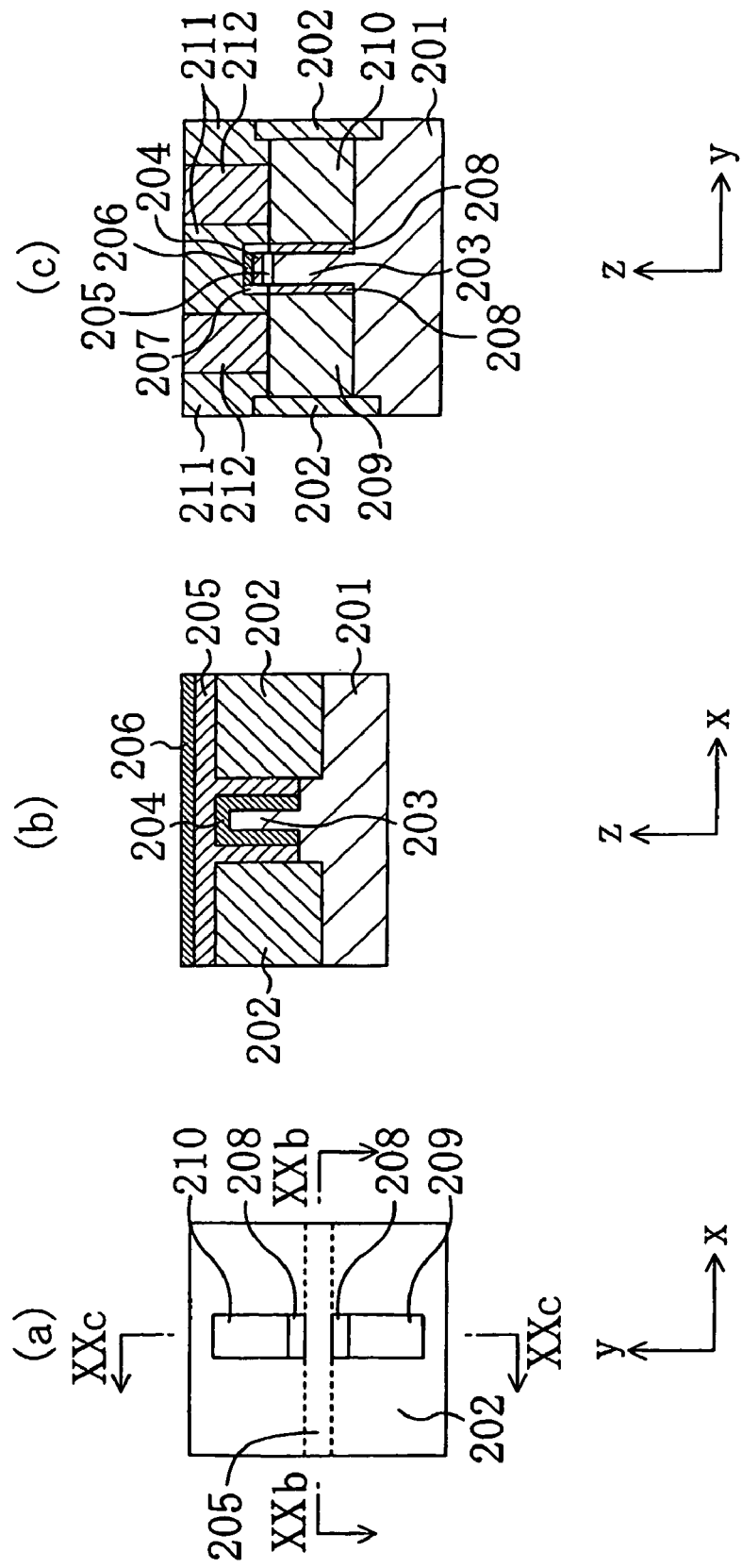
FIG. 20(a) is a plan view of an example of the known FINFET when the FINFET is viewed from the top.
FIG. 20(b) is a cross-sectional view taken along the line XXb-XXb shown in FIG. 20(a)
FIG. 20(c) is a cross-sectional view taken along the line XXc-XXc shown in FIG. 20(a).

FIG. 17(a) is a plan view of the FINFET of this embodiment viewed from the top. FIG. 17(b) is a cross-sectional view of the FINFET of this embodiment taken along the line XVIIb-XVIIb shown in FIG. 17(a). FIG. 17(c) is a cross-sectional view of the FINFET of this embodiment taken along the line XVIIc-XVIIc shown in FIG. 17(a). FIG. 18 is a perspective view illustrating the FINFET of this embodiment.

As shown in FIGS. 17(a) through 17(c), the FINFET of the second embodiment includes: a p-type well 51 which is provided in a semiconductor substrate made of Si or the like and in which a trench is formed; source and drain regions 62 and 63 each of which is provided in the trench of the p-type well 51 and contains an n-type impurity; a source-LDD region 58 which is provided so as to be in contact with the source region 62 and contains an n-type impurity at a lower concentration than that in the source region 62; a drain-LDD region 59 which is provided so as to be in contact with the drain region 63 and contains an n-type impurity at a lower concentration than that in the drain region 63; a convex semiconductor FIN 54 provided in part of the p-type well 51 located in the trench and between the source region 62 and the drain region 63 (i.e., between the source-LDD region 58 and the drain-LDD region 59); a gate insulating film 55 provided at least on a side surface of the semiconductor FIN 54 as well as the upper surface of the semiconductor FIN 54 and made of $SiO_2$ or the like; a first gate electrode 57 provided on the gate insulating film 55 so as to extend over a portion of the p-type well 51 in which the trench is not formed and made of, for example, polysilicon; a second gate electrode 64 provided on the first gate electrode 57 and made of, for example, titanium silicide; a first insulating film 53 provided on side surfaces of the source region 62 and the drain region 63 and made of $SiO_2$ or the like; gate side wall insulating films 60 (source side) and 61 (drain side) provided on both sides of the first gate electrode 57, respectively; a source electrode 65 provided on the source region 62 and made of, for example, titanium silicide; and a drain electrode 66 provided on the drain region 63 and made of, for example, titanium silicide. Then, in the FINFET of this embodiment, the gate insulating film 55 is located not only on the side and upper surfaces of the semiconductor FIN 54 but also bottom face and side walls of the trench and part of the p-type well 51 located outside of the trench. In other words, the gate insulating film 55 has a portion interposed between the first gate electrode 57 and the semiconductor FIN 54 and a portion interposed between the first gate electrode 57 and the p-type well 51. Note that the thickness of the gate insulating film 55 is about 2 nm.

Moreover, a heavily doped impurity region 52 to serve as a channel stopper layer containing a p-type impurity at a concentration of about $5 \times 10^{17}$ $cm^{-3}$ is provided in part of the p-type well 51 located at a bottom portion of the trench, i.e., part of the p-type well 51 located under the source region 62, the drain region 63 and the semiconductor FIN 54.

The FINFET of this embodiment is different from the FINFET of the first embodiment in that the gate insulating film, the second insulating film and the isolation insulating film are provided as one unit. Specifically, in the FINFET of this embodiment, the gate insulating film 55 extends to reach the outside of the trench and also takes a role corresponding to those of the second insulating film 2 (see FIG. 11) and isolation insulating film 4 of the first embodiment.

With this structure, an insulating film for insulating the first gate electrode 57 and the p-type well 51 from each other can be formed simultaneously with the gate insulating film 55. Accordingly, the number of fabrication process steps can be reduced, so that fabrication costs can be reduced. Moreover, the evenness of gate electrode portions is better than that of the FINFET of the first embodiment.

Next, an exemplary method for fabricating the FINFET of the second embodiment will be described with reference to the accompanying drawings.

FIGS. 13 through 17 are cross-sectional views illustrating respective steps for fabricating the FINFET of this embodiment. In each of FIGS. 13 through 17, (a) is a plan view of the FINFET viewed from the top; (b) is a cross-sectional view of the FINFET in the lateral direction (i.e., the x direction) shown in (a); and (c) is a cross-sectional view of the FINFET in the longitudinal direction (i.e., the y direction) shown in (a). Note that the x, y and z directions in this case are the same as those shown in FIG. 1.

Figure 2:
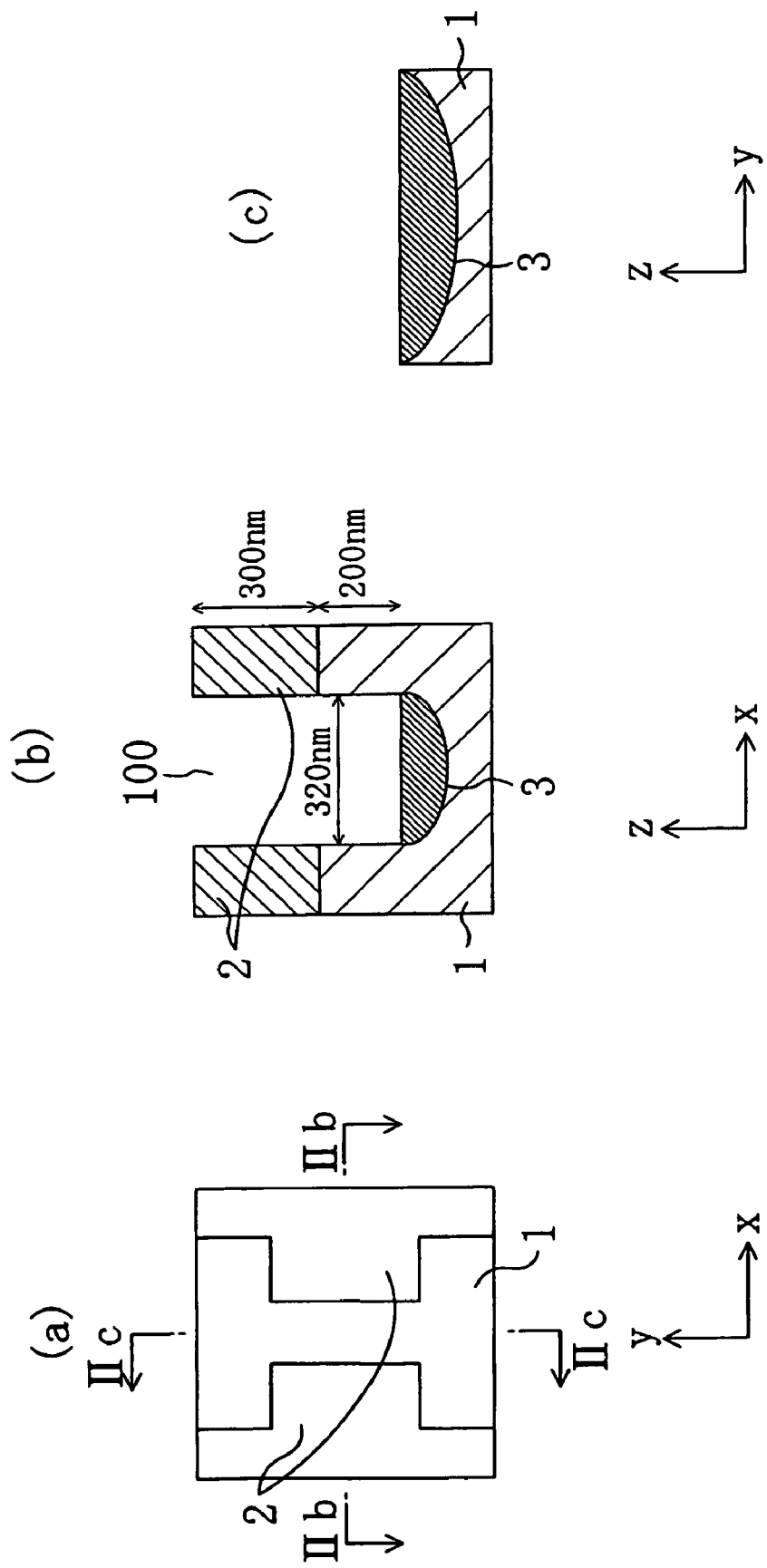
FIG. 2(a) is a plan view illustrating respective steps for fabricating the FINFET of the first embodiment.
FIGS. 2(b) and 2(c) are cross-sectional views illustrating respective steps for fabricating the FINFET.
Figure 3:
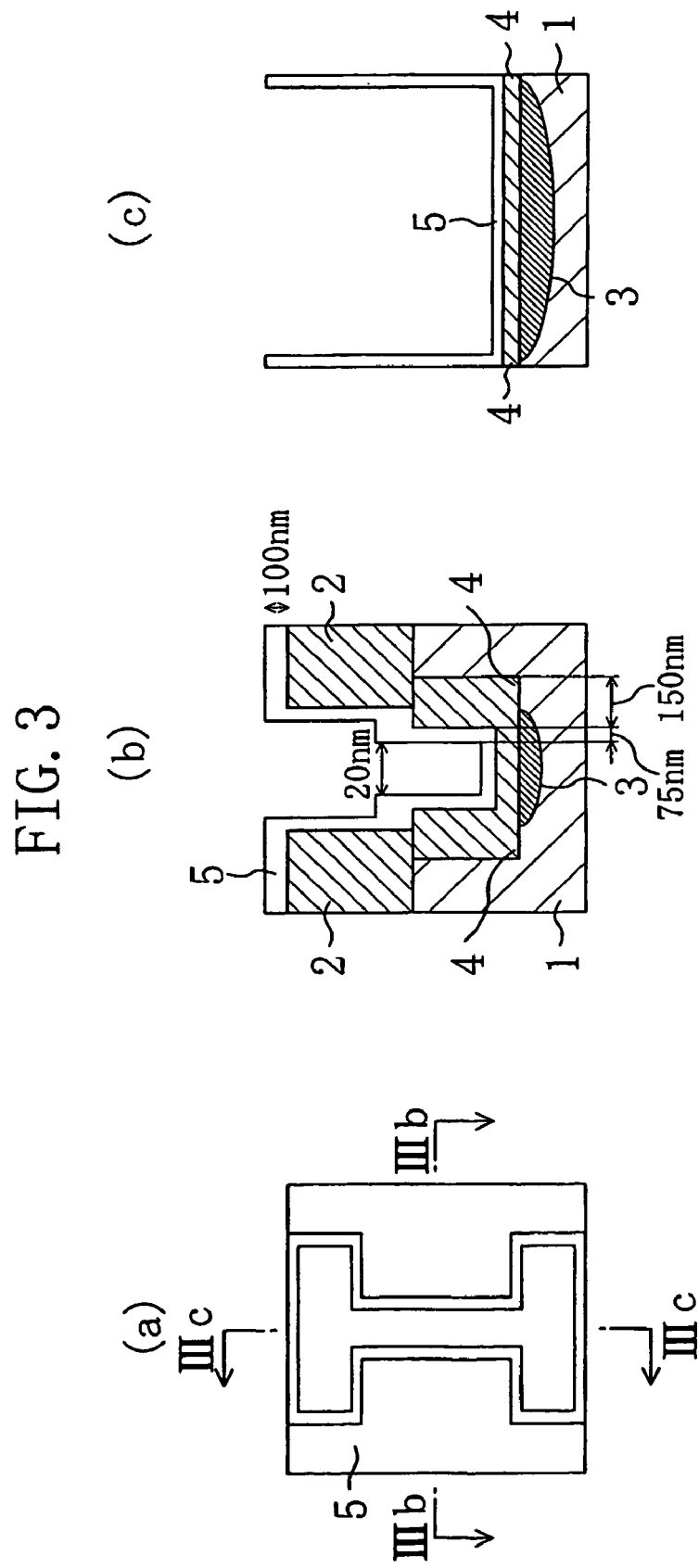
FIG. 3(a) is a plan view illustrating respective steps for fabricating the FINFET of the first embodiment.
FIGS. 3(b) and 3(c) are cross-sectional views illustrating respective steps for fabricating the FINFET.
Figure 4:
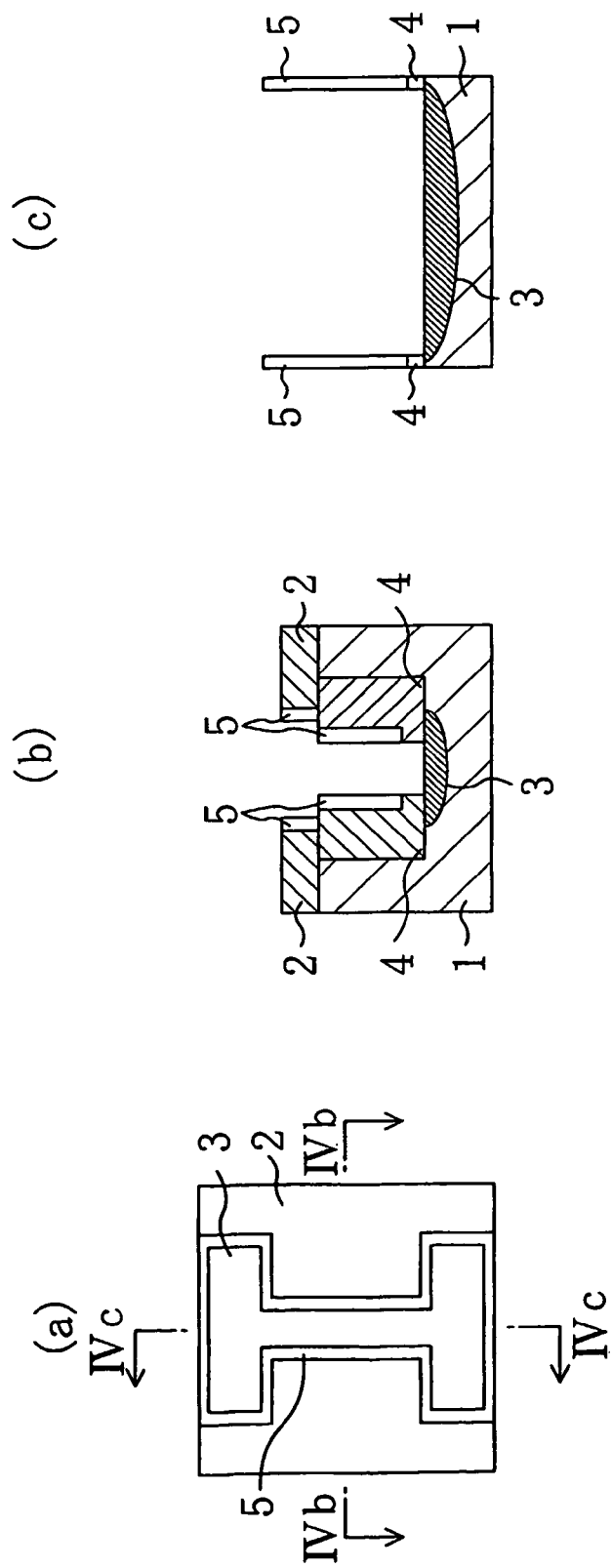
FIG. 4(a) is a plan view illustrating respective steps for fabricating the FINFET of the first embodiment.
FIGS. 4(b) and 4(c) are cross-sectional views illustrating respective steps for fabricating the FINFET.
Figure 5:
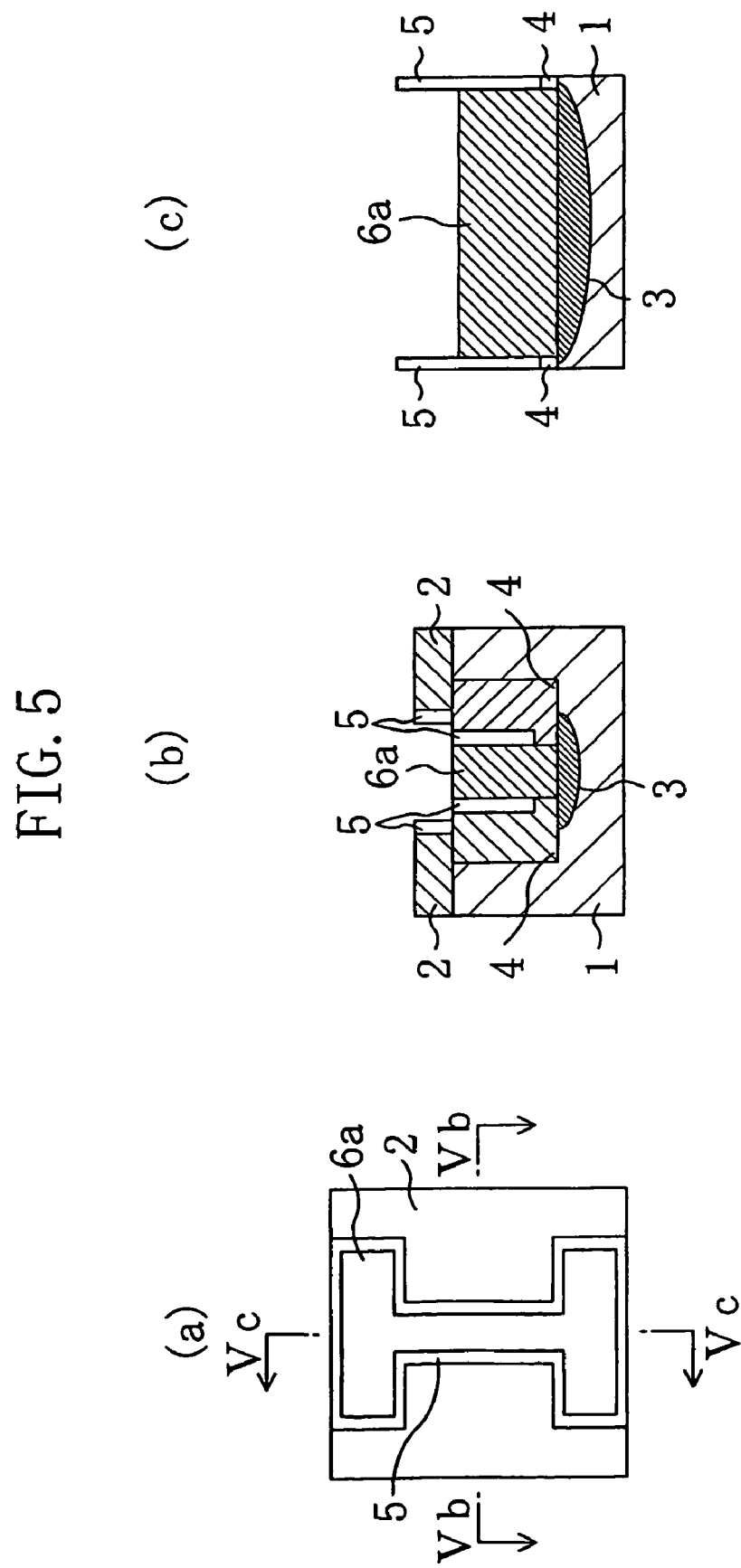
FIG. 5(a) is a plan view illustrating respective steps for fabricating the FINFET of the first embodiment.
FIGS. 5(b) and 5(c) are cross-sectional views illustrating respective steps for fabricating the FINFET.
Figure 6:
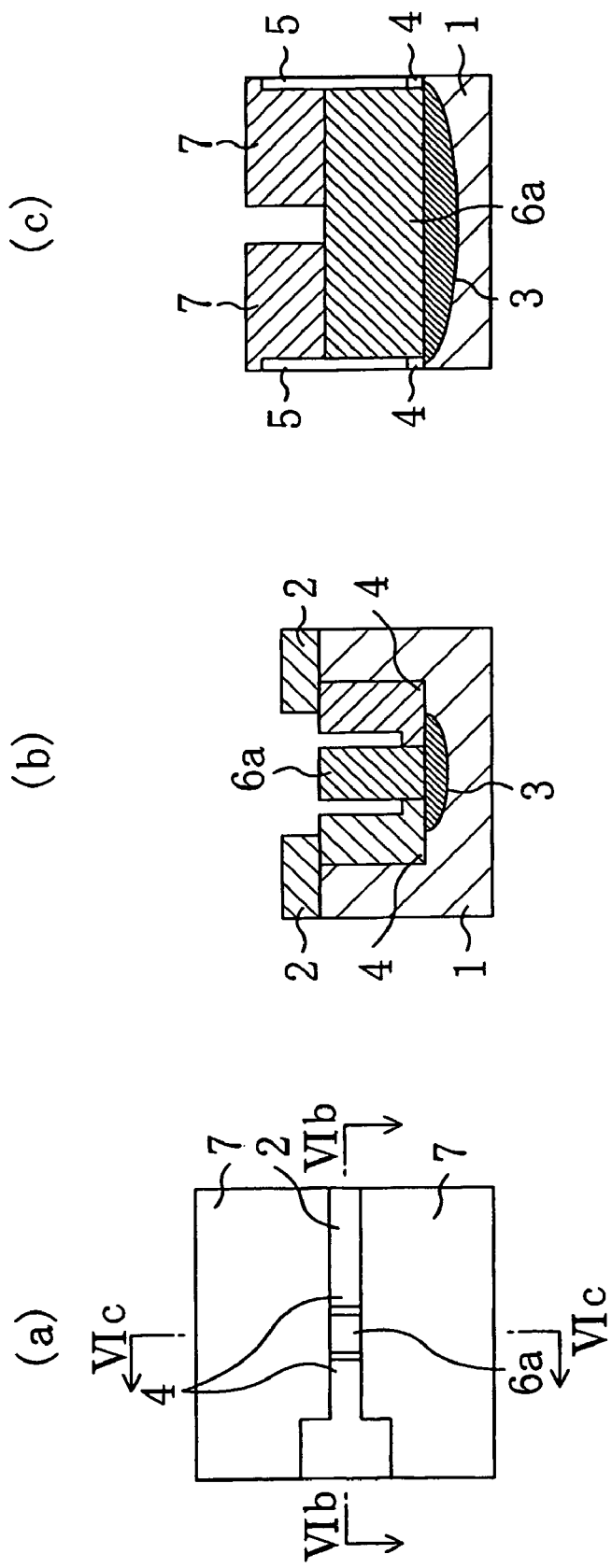
FIG. 6(a) is a plan view illustrating respective steps for fabricating the FINFET of the first embodiment.
FIGS. 6(b) and 6(c) are cross-sectional views illustrating respective steps for fabricating the FINFET.
Figure 7:
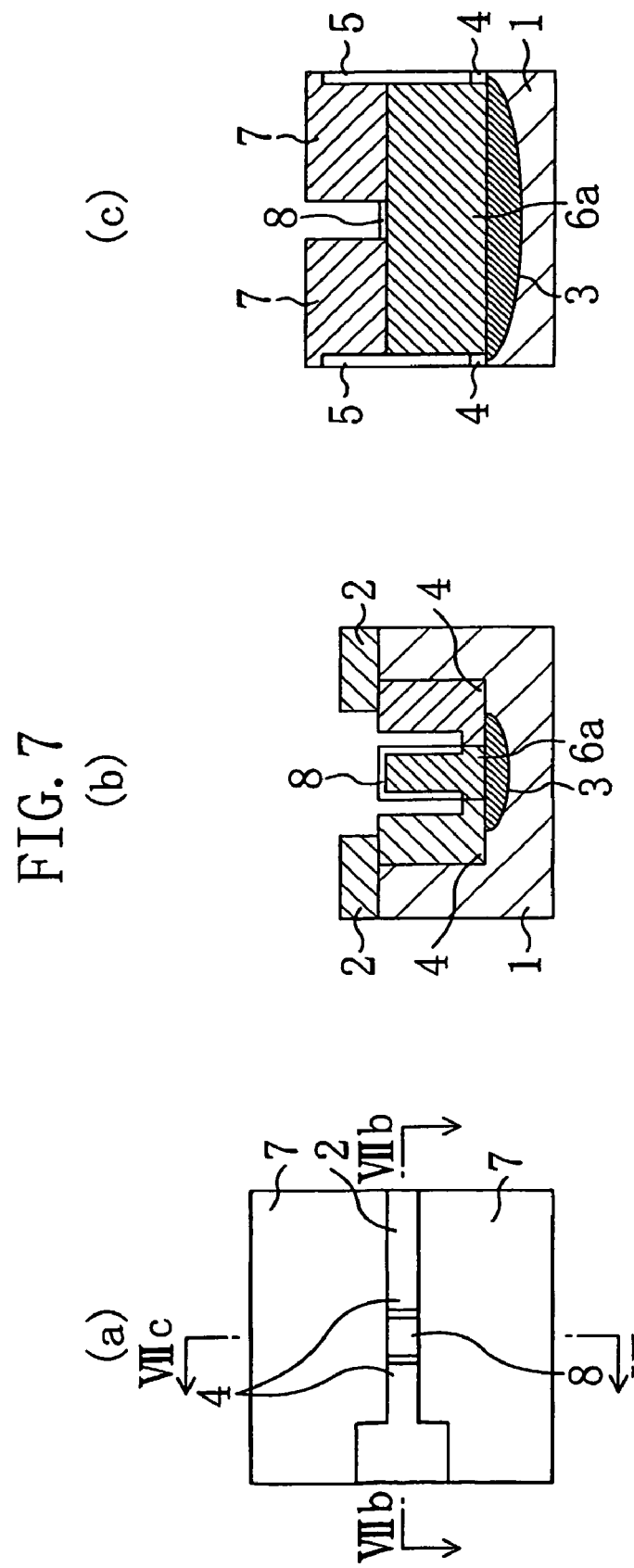
FIG. 7(a) is a plan view illustrating respective steps for fabricating the FINFET of the first embodiment.
FIGS. 7(b) and 7(c) are cross-sectional views illustrating respective steps for fabricating the FINFET.
Figure 8:
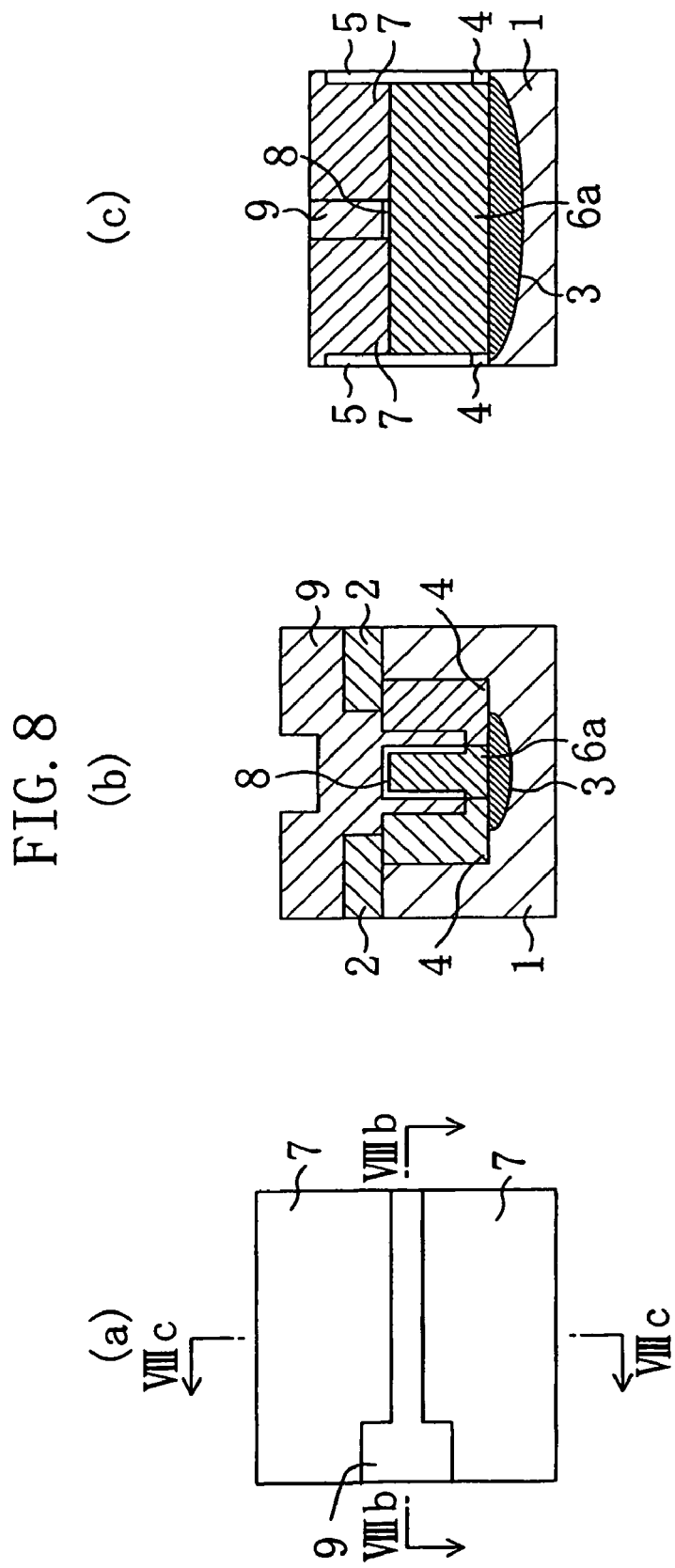
FIG. 8(a) is a plan view illustrating respective steps for fabricating the FINFET of the first embodiment.
FIGS. 8(b) and 8(c) are cross-sectional views illustrating respective steps for fabricating the FINFET.
Figure 9:
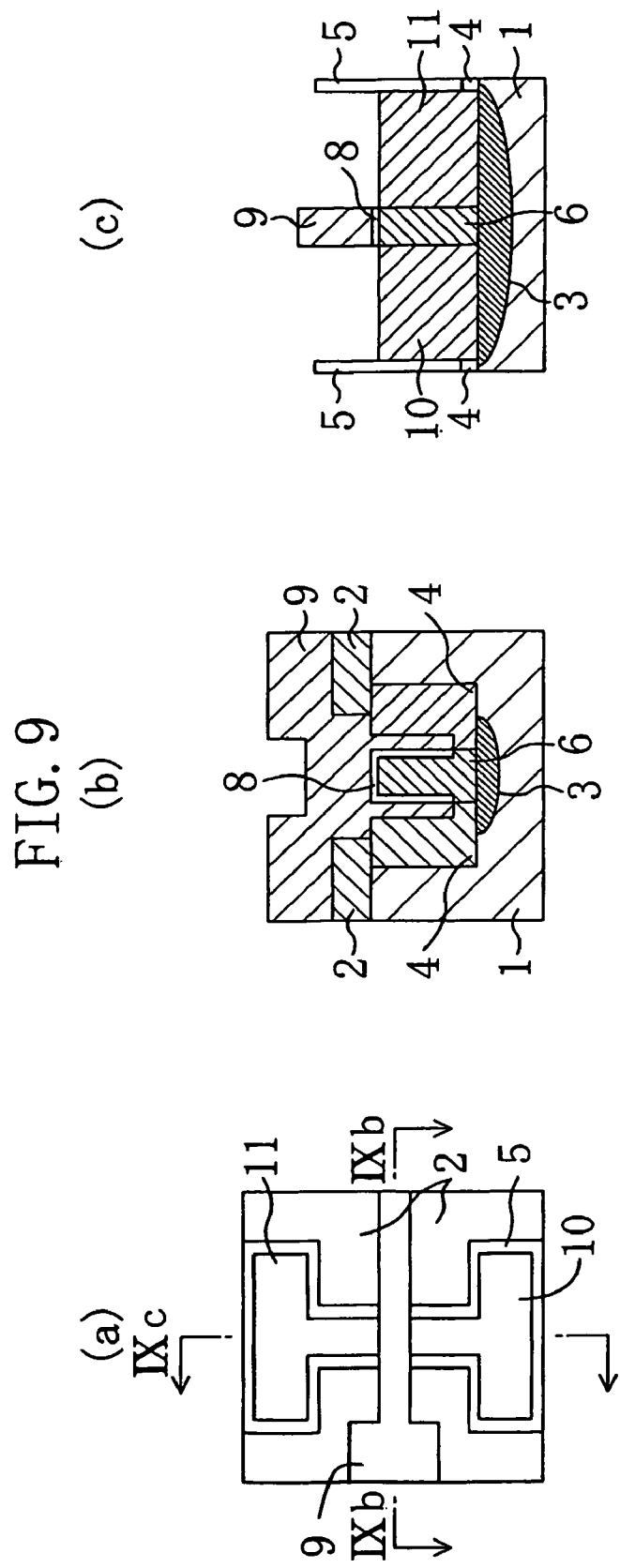
FIG. 9(a) is a plan view illustrating respective steps for fabricating the FINFET of the first embodiment.
FIGS. 9(b) and 9(c) are cross-sectional views illustrating respective steps for fabricating the FINFET.
Figure 10:
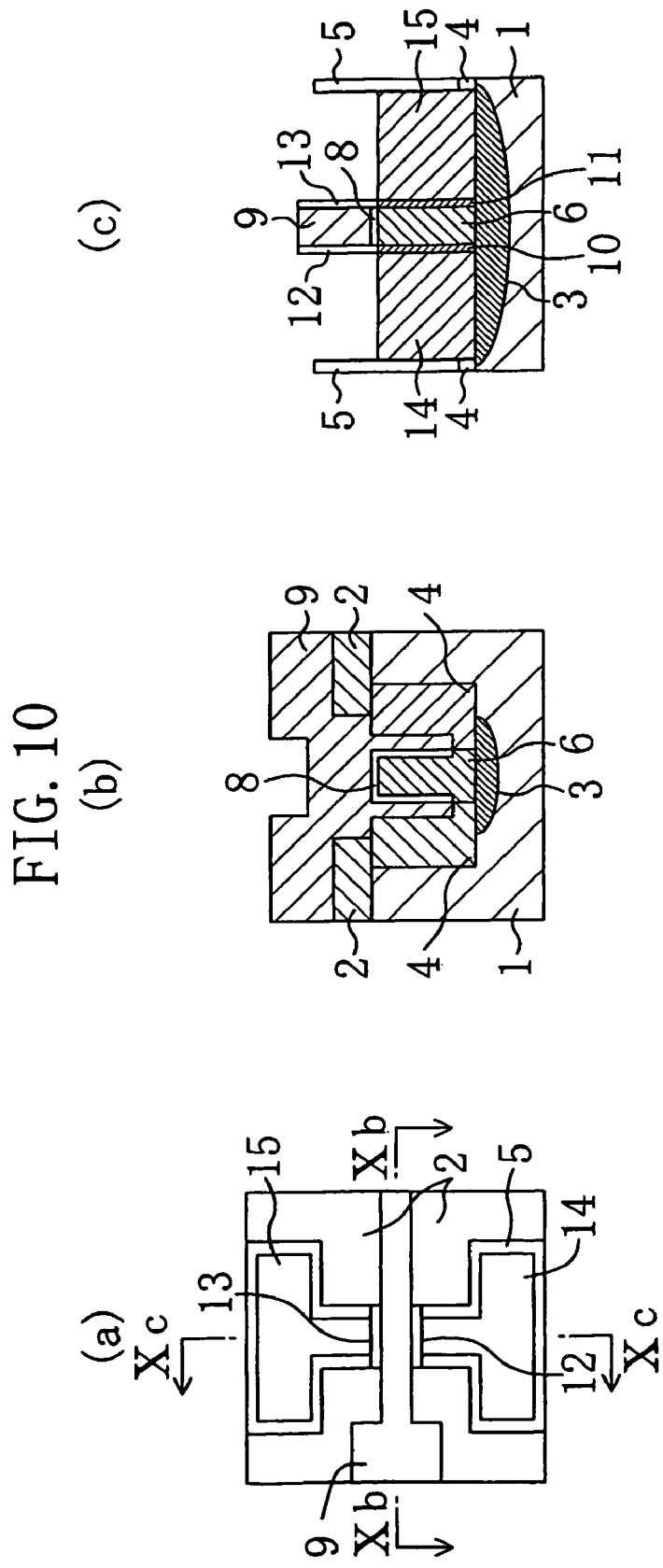
FIG. 10(a) is a plan view illustrating respective steps for fabricating the FINFET of the first embodiment.
FIGS. 10(b) and 10(c) are cross-sectional views illustrating respective steps for fabricating the FINFET.

First, in the process steps shown in FIGS. 13(a) through 13(c), an insulating film 49 made of, for example, $SiO_2$ is formed in the p-type well 51 formed on the semiconductor substrate and then, for example, using a resist 50 as a mask, the insulating film 49 and part of the p-type well 51 desired to be removed are removed to form a desired trench (which is almost the same as that of FIG. 2 and therefore not shown). This trench has the same dimensions and shape as those in the first embodiment. Thereafter, boron ions are implanted into the p-type well 51 and then annealing is performed thereto to form a p-type heavily doped impurity region 52 to serve as a channel stopper (punch-through stopper) in part of the p-type well 51 located around a bottom portion of the trench.

Next, a first insulating film 53 made of, for example, a $SiO_2$ film is formed on side surfaces of the trench. Thereafter, for example, Si is epitaxially grown on the heavily doped impurity region 52 of the p-type well 51, thereby forming a semiconductor layer 54a in the trench. The semiconductor layer 54a is formed so as to have an H shape when viewed from the top and has regions to serve as source/drain pads and a portion corresponding part of the H shape having a small width. The portion of the semiconductor layer 54a having the small width is to be a semiconductor FIN 54 in a later process step.

Next, in the process steps shown in FIGS. 14(a) through 14(c), for example, using as a mask a resist 56 having an opening in a region in which a first gate electrode 57 is to be formed, parts of the first insulating film 53 and the insulating film 49 provided in part of the semiconductor layer to be the semiconductor FIN 54 are removed, so that part of the semiconductor layer 54a which is to be the semiconductor FIN 54 is exposed. Subsequently, exposed part of the semiconductor layer 54a which is later to be the semiconductor FIN 54 and exposed part of the p-type well 51 are oxidized to form a gate insulating film 55. The gate insulating film 55 formed in this embodiment is provided so as to be located not only on side and upper surfaces of the part to be the semiconductor FIN but also on a bottom portion and side walls of the trench and part of the p-type well 51 located outside of the trench.

Next, in the process steps shown in FIGS. 15(a) through 15(c), using the resist 56 as a mask, polysilicon is deposited so as to fill an empty space and also to be located over the part of the semiconductor layer 54a which is to be the semiconductor FIN 54 with the gate insulating film 55 interposed between the resist and the part of the semiconductor layer 54a. Thus, a first gate electrode 57 is formed. Subsequently, after the resist 56 has been removed, using the first gate electrode 57 as a mask, for example, phosphorus ions are implanted into the semiconductor layer 54a to form a source-LDD region 58 and a drain-LDD region 59 in regions of the semiconductor layer 54a located on both sides of and under the first gate electrode 57, respectively.

Next, in the process steps shown in FIGS. 16(a) through 16(c), after gate side wall insulating films 60 and 61 have been formed by a known method, using as a mask the first gate electrode 57 and the gate side wall insulating films 60 and 61, for example, phosphorus ions are implanted to form a source region 62 and a drain region 63 in parts of the semiconductor layer 54a located on both sides of and under the first gate electrode 57, respectively. Note that through these process steps and the process steps of forming LDD regions shown in FIGS. 15(a) through 15(c), part of the semiconductor layer 54a (except for LDD regions) overlapping with the first gate electrode 57 when viewed from the top becomes a convex semiconductor FIN 54.

Next, in the process steps shown in FIGS. 17(a) through 17(c), upper surface portions of the first gate electrode 57, the source region 62 and the drain region 63 are made into, for example, titanium silicide to form a second gate electrode 64, a source electrode 65 and a drain electrode 63 on the first gate electrode 57, the source region 62 and the drain region 63, respectively. In this manner, the FINFET of this embodiment of FIG. 18 is formed.

According to this embodiment, the height of a substrate surface in regions of the substrate of the FINFET in which the source electrode 65 and the drain electrode 66 are formed and the height of a substrate surface in regions of the substrate of a planar MOSFET in which a source electrode and a drain electrode are formed can be also made substantially the same.

According to the FINFET of this embodiment, the gate insulating film 55 formed in the process steps shown in FIGS. 14(a) through 14(c) also has the function as an isolation insulating film between the fist gate electrode 57 and the p-type well 51. Accordingly, in the method for fabricating a FINFET according to this embodiment, the process step of forming an isolation insulating film is not needed, so that a semiconductor device can be formed in a more simple manner than in the method for fabricating a semiconductor device according to the first embodiment. Moreover, in the FINFET of this embodiment, the thickness of the gate insulating film 55 is substantially uniform in a thickness of 2 nm. The first gate electrode 57 has also excellent evenness.

Note that the gate insulating film 55 functions as an isolation insulating film between the first gate electrode 57 and the p-type well 51, so that the breakdown voltage of the FINFET of this embodiment is limited. However, even if the thickness of the gate insulating film functioning as an isolation insulating film is about 2 nm, the first gate electrode 57 and the p-type well 51 can be electrically isolated because as the size of the semiconductor integrated circuits is reduced, the supply voltage is reduced. Therefore, the FINFET of this embodiment is preferably used in a circuit for low voltage application.

Note that in the semiconductor device of each of the first and second embodiment, as a material for the semiconductor FIN, besides epitaxially grown silicon, silicon germanium ($Si_{1-x}Ge_x$ ($0<x\leq1$)), silicon germanium carbon ($Si_{1-y-z}Ge_yC_z$ ($0<y<1$, $0<z<$, $0<y+z<1$)) or the like may be used.

Moreover, in this embodiment, the FIN is a silicon semiconductor and a side wall for forming the FIN is an insulating film (the first insulating film 53). However, a FIN and a side wall may be formed of a silicon germanium semiconductor and a silicon semiconductor in this combination with which selective etching can be performed.

Moreover, the gate insulating film 55 is not limited to the $SiO_2$ film but may be firmed of a SiN film or a high-k material. A material for the first gate electrode 57 is not limited to polysilicon, as long as the material is a conductive material. Specifically, a metal material such as W (tungsten) may be used.

INDUSTRIAL APPLICABILITY

A semiconductor device according to the present invention is used for electronic equipment required to have a reduced-size and improved-performance, and more particularly, the semiconductor device is used for electronic equipment in which a semiconductor device such as a planar MOSFET and a FINFET are mounted together.

The invention claimed is:
1. A semiconductor device, comprising:
a substrate, and
a semiconductor region formed in a predetermined area of the substrate, said semiconductor region having a predetermined concentration of an impurity and a principal surface, wherein:
in the semiconductor device, a first transistor having a semiconductor FIN structure and a second transistor having a planar structure are integrated in the semiconductor region,
the first transistor includes:
  a trench region formed in the semiconductor region so as to have a concave shape with a bottom surface located at a lower position than the principal surface of the semiconductor region, said trench region having first side surfaces,
  source/drain regions each of which is formed so as to be buried in the trench region, said source/drain regions containing an impurity,
  a semiconductor FIN structure formed in the trench region so as to be buried in the trench region, and located between the source/drain regions, said semiconductor FIN having a convex shape with an upper surface and second side surfaces,
  an isolation insulating film formed in the trench region so as to be buried between the source/drain regions and the first side surfaces of the trench region, and between the semiconductor FIN structure and the first side surfaces of the trench region,
  a gate insulating film disposed on the upper surface and both side surfaces of the semiconductor FIN structure, and,
  a gate electrode disposed on the second side surfaces and the upper surface of the semiconductor FIN structure with the gate insulating film interposed therebetween, and between the second side surfaces of the semiconductor FIN structure and the isolation insulating film,
the second transistor is formed on a part of the principal surface of the semiconductor region outside said trench region, and
the upper surface of the FIN structure of the first transistor does not protrude from the principal surface of the semiconductor region.
2. The semiconductor device of claim 1, wherein an upper surface of each of the source/drain regions of the first transistor and an upper surface of each of the source/drain regions of the second transistor are located substantially at the same level.
3. The semiconductor device of claim 2, wherein the upper surface of the semiconductor FIN structure of the first tran- sistor is located substantially at the same level as those of the upper surfaces of the source/drain regions of the first and second transistors.

4. The semiconductor device of claim 1, wherein:
the gate electrode formed on the upper surface of the semiconductor FIN structure of the first transistor extends orthogonally to the direction of a line connecting the source/drain regions of the first transistor, and
the gate electrode extends onto a part of the semiconductor region extending outwardly from the trench region.

5. The semiconductor device of claim 1, wherein the gate electrode of the first transistor has an extension portion extending onto the part of the semiconductor region extending outwardly from the trench region, and an insulation film is formed between the extension portion and the semiconductor region.

6. The semiconductor device of claim 1, wherein a direction in which the gate electrode formed on the upper surface of the semiconductor FIN structure of the first transistor extends is parallel to a direction in which the gate electrode of the second transistor extends.

7. The semiconductor device of claim 1, wherein the gate electrode of the first transistor is formed so that a part of the gate electrode located on the upper surface of the semiconductor FIN structure has a larger thickness than that of a part of the gate electrode located on each of the side surfaces of the semiconductor FIN structure.

8. The semiconductor device of claim 1, wherein a part of the gate electrode of the first transistor located on each of the side surfaces of the semiconductor FIN structure is made of a first material and a part of the gate electrode located on the upper surface of the semiconductor FIN structure is made of the first material and a second material.

9. The semiconductor device of claim 8, wherein the first material is polysilicon and the second material is silicide.

10. The semiconductor device of claim 1, wherein the gate insulating film is formed so that a part of the gate insulating film located on the upper surface of the semiconductor FIN structure has a larger thickness than that of a part of the gate insulating film located on each of the side surfaces of the semiconductor FIN structure.

11. The semiconductor device of claim 1, wherein the semiconductor FIN structure is made of SiGe or SiGeC.

12. The semiconductor device of claim 1, wherein each of the source/drain regions of the second transistor has a larger width than that of the semiconductor FIN structure.

13. The semiconductor device of claim 1, wherein the semiconductor FIN structure of the first transistor and the source/drain regions of the first transistor form an H shape when viewed from the top.

14. The semiconductor device of claim 1, wherein an LDD region is formed in each of the source/drain regions of the first transistor.

15. The semiconductor device of claim 1, wherein each of the source/drain regions of the first transistor is formed so as to extend from the upper surface of the semiconductor FIN structure to a bottom surface of the semiconductor FIN structure.

16. The semiconductor device of claim 1, wherein the bottom part of the trench region of the first transistor includes a heavily doped impurity layer region having a higher concentration of an impurity than that of the semiconductor region.

17. The semiconductor device of claim 1, wherein the gate electrode formed on the semiconductor FIN structure of the first transistor and the gate electrode of the second transistor are made of the same material.

18. The semiconductor device of claim 1, wherein:
source/drain electrodes are formed respectively on the source/drain regions of the first transistor,
source/drain electrodes are formed respectively on the source/drain regions of the second transistor, and
the source/drain electrodes are made of the same material.

19. The semiconductor device of claim 1, wherein an isolation insulating film is formed between each of the source/drain regions of the second transistors and the semiconductor region.

20. A semiconductor device comprising:
a substrate, and
a semiconductor region formed in a predetermined area of the substrate, said semiconductor region having a predetermined concentration of an impurity and a principal surface, wherein:
in the semiconductor device, a first transistor having a semiconductor FIN structure and a second transistor having a planar structure are integrated in the semiconductor region,
the first transistor includes:
a trench region formed in the semiconductor region so as to have a concave shape with a bottom surface located at a lower position than the principal surface of the semiconductor region, said trench region having first side surfaces,
source/drain regions each of which is formed so as to be buried in the trench region, said source/drain regions containing an impurity,
a semiconductor FIN structure formed in the trench region so as to be buried in the trench region, and located between the source/drain regions, said semiconductor FIN having a convex shape with an upper surface and second side surfaces,
an isolation insulating film formed in the trench region so as to be buried between the source/drain regions and the first side surfaces of the trench region, and between the semiconductor FIN structure and the first side surfaces of the trench region,
a gate insulating film disposed on the upper surface and both side surfaces of the semiconductor FIN structure, and,
a gate electrode disposed on the second side surfaces and the upper surface of the semiconductor FIN structure with the gate insulating film interposed therebetween, and between the second side surfaces of the semiconductor FIN structure and the isolation insulating film,
the second transistor is formed on a part of the principal surface of the semiconductor region outside said trench region, and
the upper surface of the FIN structure, the principal surface of the semiconductor region, an upper surface of each of the source/drain regions of the first transistor and an upper surface of each of the source/drain regions of the second transistor are located substantially at the same level.

* * * * *

UNITED STATES PATENT AND TRADEMARK OFFICE
CERTIFICATE OF CORRECTION

| | | |
|---|---|---|
| PATENT NO. | : 7,986,002 B2 | Page 1 of 1 |
| APPLICATION NO. | : 10/549291 | |
| DATED | : July 26, 2011 | |
| INVENTOR(S) | : Junko Iwanaga et al. | |

It is certified that error appears in the above-identified patent and that said Letters Patent is hereby corrected as shown below:

On the title page, in Item (54) and Column 1, Lines 1-3, Title

Please change "FINFET-TYPE SEMICONDUCTOR DEVICE AND METHOD FOR FABRICATING THE SAME" to -- SEMICONDUCTOR DEVICE AND METHOD FOR FABRICATING THE SAME --.

On the title page, in Item (86)

"§ 371 (c)(1), (2), (4) Date: Sep. 14, 2005", change to -- § 371 (c)(1), (2), (4) Date: Sep. 16, 2005. --.

Signed and Sealed this
Seventeenth Day of July, 2012

David J. Kappos
*Director of the United States Patent and Trademark Office*